(12) United States Patent
Lang et al.

(10) Patent No.: US 9,704,689 B2
(45) Date of Patent: Jul. 11, 2017

(54) METHOD OF REDUCING THE THICKNESS OF A TARGET SAMPLE

(71) Applicant: Oxford Instruments Nanotechnology Tools Limited, Oxon (GB)

(72) Inventors: Christian Lang, Oxon (GB); Peter Statham, Oxon (GB); Cheryl Hartfield, Oxon (GB)

(73) Assignee: Oxford Instruments Nanotechnology Tools Limited, Oxon (GB)

( * ) Notice: Subject to any disclaimer, the term of this patent is extended or adjusted under 35 U.S.C. 154(b) by 0 days.

(21) Appl. No.: 14/890,114

(22) PCT Filed: May 12, 2014

(86) PCT No.: PCT/GB2014/051441
§ 371 (c)(1),
(2) Date: Nov. 9, 2015

(87) PCT Pub. No.: WO2014/181132
PCT Pub. Date: Nov. 13, 2014

(65) Prior Publication Data
US 2016/0093468 A1    Mar. 31, 2016

(30) Foreign Application Priority Data

May 10, 2013   (GB) .................................. 1308436.3

(51) Int. Cl.
*H01J 37/285*   (2006.01)
*H01J 37/30*    (2006.01)
(Continued)

(52) U.S. Cl.
CPC ........ *H01J 37/304* (2013.01); *H01J 37/3053* (2013.01); *H01J 2237/30466* (2013.01); *H01J 2237/3151* (2013.01)

(58) Field of Classification Search
CPC ................. H01J 37/304; H01J 37/3053; H01J 2237/3151; H01J 2237/30466
(Continued)

(56) References Cited

U.S. PATENT DOCUMENTS 5,055,696 A    10/1991   Haraichi et al.
5,616,921 A    4/1997    Talbot et al.
(Continued)

OTHER PUBLICATIONS

K. Iakoubovskii, et al., "Thickness Measurements with Electron Energy Loss Spectroscopy", Microscopy Research and Technique, vol. 71, 2008, pp. 626-631.
(Continued)

*Primary Examiner* — Nicole Ippolito
(74) *Attorney, Agent, or Firm* — Blank Rome LLP

(57) ABSTRACT

A method is provided of reducing the thickness of a region of a target sample. Reference data is obtained that is representative of x-rays generated by a particle beam being directed upon part of a reference sample under a first set of beam conditions. Under a second set of beam conditions the particle beam is directed upon the region of the target sample. The resultant x-rays are monitored as monitored data. Output data are then calculated based upon the reference and the monitored data. Material is then removed from the region, so as to reduce its thickness, in accordance with the output data.

40 Claims, 15 Drawing Sheets

(51) Int. Cl.
*H01J 37/305* (2006.01)
*H01J 37/304* (2006.01)

(58) Field of Classification Search
USPC .... 250/305, 306, 307, 309, 310, 311, 492.1, 250/492.2, 492.21, 492.22, 492.23, 492.3
See application file for complete search history.

(56) References Cited

U.S. PATENT DOCUMENTS

| | | |
|---|---|---|
| 6,751,516 B1 | 6/2004 | Richardson |
| 8,227,781 B2 | 7/2012 | Zaykova-Feldman et al. |
| 2011/0064191 A1* | 3/2011 | Toth ................. G01N 23/20033 378/53 |
| 2012/0187285 A1 | 7/2012 | Young et al. |

OTHER PUBLICATIONS

J. Meyer et al., "TEM sample preparation and FIB-induced damage," MRS Bulletin, 32, May 2007, pp. 400-407, www.mrs.org/bulletin.
A. Hall, "In Situ thickness assessment during ion milling of a free-standing membrane using transmission helium ion microscopy," Microscopy and Microanalysis 19, 740-744, 2013.
J.L. Pouchou, "X-Ray microanalysis of stratified specimens," Anal. Chim. Acta 283 (1993) 81-97.

\* cited by examiner

| | |
|---|---|
| Calibration Cu K area counts = 801050 | |
| Live time for spectrum acquisition (secs) = 30 | |
| Calibration intensity (counts/sec) = 26702 | |
| Derived intensity for Si K on pure Si (counts/sec) = 151280 | |
| Derived intensity for Ga K on pure Ga (counts/sec) = 18199 | |

| First lamella spectrum results: | | | |
|---|---|---|---|
| Live time (secs) = 300 | | | |
| Emission | Counts | Counts/sec | K-ratio |
| Si K | 723422.6 | 2411.4 | 0.01594 |
| Ga K | 8752.1 | 29.2 | 0.0016 |

| Result of iterative thickness calculation: | |
|---|---|
| Layer1 ($Ga_{0.1} Si_{0.9}$) | 19.7 nm |
| Layer2 (Si) | 47 nm |
| Substrate (Be) | |

| Second Lamella spectrum results: | | | |
|---|---|---|---|
| Live time (secs) = 300 | | | |
| Emission | Counts | Counts/sec | K-ratio |
| Si K | 629173.6 | 2097.2 | 0.01386 |
| Ga K | 4373.4 | 14.6 | 0.0008 |

| Result of iterative thickness calculation: | |
|---|---|
| Layer1 ($Ga_{0.1} Si_{0.9}$) | 9.7 nm |
| Layer2 (Si) | 47.4 nm |
| Substrate (Be) | |

*FIG. 17*

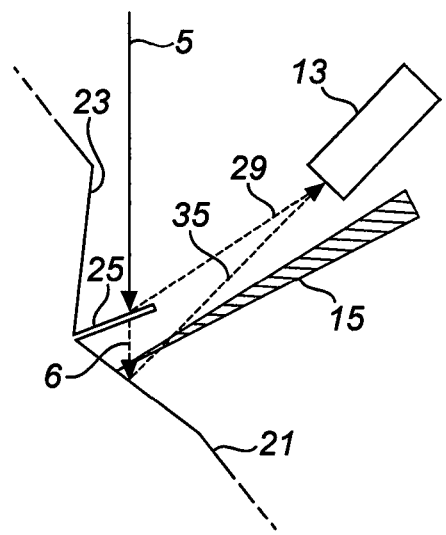
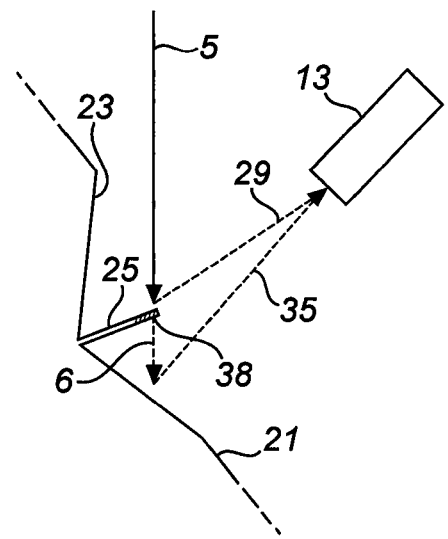
FIG. 21a  FIG. 21b
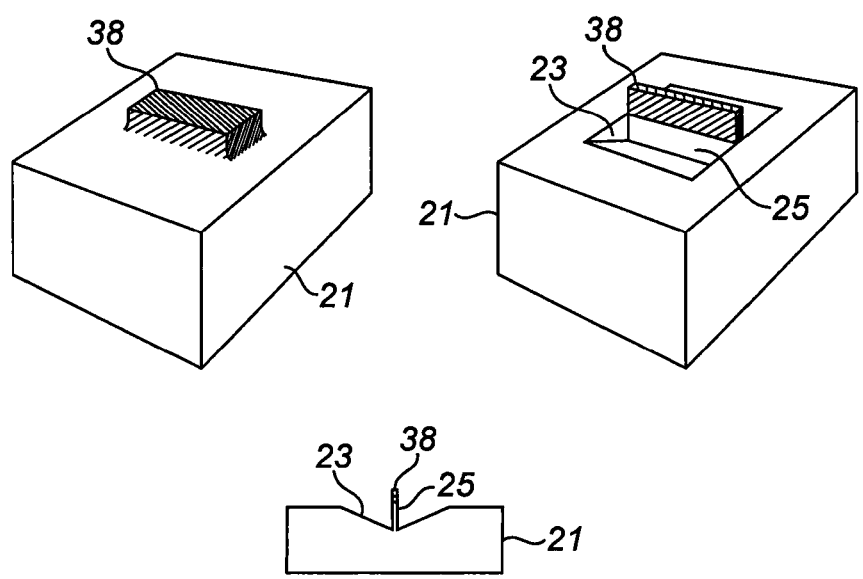
FIG. 22

METHOD OF REDUCING THE THICKNESS OF A TARGET SAMPLE

RELATED APPLICATIONS

This application is a national phase application of PCT/GB2014/015441, filed May 12, 2014, which claims priority to Great Britain Patent Application No. 1308436.3, filed May 10, 2013, the entire contents of which are incorporated herein by reference.

FIELD OF THE INVENTION

The present invention relates to a method of reducing the thickness of a region of a target sample.

BACKGROUND TO THE INVENTION

As the structures making up functional units across several industries now approach the nanoscale (<100 nm), metrology of these structures becomes ever more challenging. To resolve structures at this scale commonly electron microscopy is employed as it offers an image resolution below 1 nm for some scanning electron microscopes (SEMs) and below 0.1 nm for some transmission electron microscopes (TEMs). In order to prepare SEM and TEM samples of specific structures and devices, the capability to image and cut with very high precision is crucial. The cutting can be performed either by employing ultra-precise blades in an ultra-microtome or by using finely focused beams of charged ions in so called focused ion beam microscopes (FIBs). Machines combining the capabilities of FIBs and SEMs, commonly referred to as FIB-SEMs as well as ultra-microtomes are available on the market.

When investigating structures with at least one dimension <200 nm it is often advantageous to prepare so called 'lamellas' containing a cross-section of the structures of interest. Ideally, the lamella thickness is of a similar dimension to the structures of interest. The lamellas are cut from an original sample. Depending on the application and the technique used for analysis, the lamella may remain attached to the original sample or be removed from the sample using a manipulator. Different types of manipulators are available to lift the sample out in the microscope chamber (in situ lift-out) or outside the chamber under an optical microscope (ex situ lift-out). Once the lamella is attached to the manipulator needle it can either be analysed directly on the needle or be transferred onto a holder for further analysis. In the case of an in situ manipulator in a FIB or FIB-SEM the lamella can be thinned further on the needle or once it has been transferred onto a suitable substrate. Equipment and techniques are also available to further thin samples ex situ.

Independent of the exact lamella geometry, the lamella thickness is a vital parameter as it strongly influences the quality of the analysis performed on the lamella. Methods to measure the lamella thickness exist in the prior art:
(1) The thickness can be measured approximately by imaging the lamella edge on. However, this assumes that the lamella has parallel side-walls which is not usually the case.
(2) A STEM detector can be used to measure the intensity of an electron beam (as in US2012/0187285) transmitted through the lamella and comparing this intensity to a calibration curve obtained from the same material.
(3) The intensity of a beam of transmitted light can be measured using a photodetector. The lamella thickness can be determined by comparing the light intensity to a calibration curve obtained from the same material (as in our earlier patent U.S. Pat. No. 8,227,781).
(4) The thickness can be determined by comparing the intensity of a beam of transmitted He-ions detected using a secondary electron detector to a calibration curve from the same material (see 'In-situ Thickness Assessment during Ion Milling of a Free-Standing Membrane Using Transmission Helium Ion Microscopy', Microscopy and Microanalysis Epub Apr. 29, 2013).
(5) Once the lamella is transferred into a TEM, the thickness can be measured using Electron Energy Loss Spectroscopy (see Iakoubovski et al., 'Thickness Measurements With Electron Energy Loss Spectroscopy', Micr. Res. Tech 71, p. 626 (2008)).

All the present methods have clear disadvantages. Method (1) is approximate and not suitable for lamellas where the thickness varies. Variation is common due to differential material milling rates, alignment issues or redeposition in the case of FIB preparation. Method (2) to (4) require pre-existing calibration curves on the same material as the sample being prepared. These calibration curves are not straightforward to obtain. Method (5) requires the removal of the lamella from the FIB or SEM where it is being prepared and measurement in a TEM which is time consuming.

Also, when preparing lamellas with a FIB or a FIB-SEM, implantation of ions into the sidewalls of the lamella occurs. The implanted layer is usually damaged ("amorphised") by the milling process and therefore has to be removed before the analysis. This can be done by using very low energy ion milling in the FIB or by removing the lamella from the FIB and using other techniques like low angle argon ion milling (see J. Mayer et al, 2007, MRS bulletin, vol. 32 400-407). However, the exact thickness of the amorphous layer is difficult to determine with established techniques and therefore usually literature values obtained using 30 kV gallium ions milling silicon are used. This causes issues of either removing too much material and thereby accidentally removing part of the intact lamella or not removing enough material which results in poor image quality during analysis of the lamella in an SEM or TEM.

Despite the various known techniques there exists a need for a practical technique which addresses the problems known in the prior art. It is in this context that the present invention has been devised.

SUMMARY OF THE INVENTION

In accordance with the invention we provide a method of reducing the thickness of a region of a target sample, comprising:
a) obtaining reference data that is representative of x-rays generated by the interaction of a particle beam with part of a reference sample under a first set of beam conditions;
b) causing the particle beam, under a second set of beam conditions, to impinge upon the region of the target sample;
c) monitoring x-rays generated by the interaction between the particle beam and the target sample so as to produce monitored data;
d) calculating output data based upon the monitored and reference data; and
e) removing material from the region of the target sample so as to reduce the thickness of the region in accordance with the output data.

We have realised that an x-ray based technique can be used to significant advantage in providing information on the thickness of a region of the target sample which, in turn, can then be used to guide a "thinning" process. The use of x-rays represents a significant departure from known methods and is rather counterintuitive since it will be understood that the interaction volume for generating the x-rays in such samples is very small. The invention can therefore be thought of as providing a method of monitoring and reducing the thickness of a sample in order to firstly, obtain a sample of a specific thickness and secondly, to determine the end point of the thickness reduction procedure so that the sample contains a specific feature of interest. The monitoring of x-rays and the calculation of output data can be done before, after or during the removal of the material from the region of the target sample. Typically the monitoring includes a resultant measured thickness of the region.

In order to predict theoretically the x-ray intensity from any known structure and composition it is necessary to obtain by some means reference parameters pertaining to the particular configuration in use.

Typically, the reference data is representative of the x-rays in the sense that it may include intensity data or at least data sufficient to allow the calculation of the output data when considered with the monitored data. Such data may therefore include the parameters for enabling a theoretical representation whereby the generated x-rays may be predicted from a known reference sample.

A number of factors contribute to the measured intensity of generated x-rays from a sample of known composition and structure, such as the beam conditions, including the beam current, and the properties and configuration of the x-ray detector. Some aspects, for instance the efficiency, and solid angle subtended by, the detector are difficult to determine accurately in practical measurements but techniques do exist by which these parameters may be measured or predicted, thereby allowing the theoretical representation of produced spectra. Alternatively, to deduce the thickness of a material using x-rays, the observed x-ray intensity from an unknown sample can be compared with the intensity obtained from a known reference sample under the same conditions. Thus an alternative approach is to obtain reference data that are the actual intensities found by monitoring the x-rays generated within a physical reference sample. This physical reference method therefore enables step (a) to be performed without the requirement that the above mentioned parameters be quantified.

The reference sample may have bulk dimensions which are sufficient for the sample to act as a bulk material in response to the particle beam. Furthermore, the reference sample may have known dimensions, particularly in the case where such dimensions are smaller than are needed for the sample to act as a bulk material.

Typically therefore, step (a) may be performed to establish a theoretical representation in which reference data is determined that allows the generated x-rays for a known sample to be predicted in accordance with the first set of beam conditions. Alternatively, the reference data in step (a) is obtained by causing the particle beam to impinge upon part of a physical reference sample under the first set of beam conditions and monitoring x-rays generated by the interaction between the particle beam and the reference sample so as to produce the reference data;

The method may include the performance of step (a) at a different time from steps (b) and (c). This might be advantageous for example if step (a) is performed as part of a "pre-calibration" step at the time of installation of the apparatus originally. It also enables a greater range of physical reference sample geometries to be used. In such circumstances the beam conditions cannot be safely assumed to be the same. Hence the first set of beam conditions may be different from the second set of beam conditions, particularly in terms of the beam current. Thus, particularly when step (a) is performed at a different time from steps (b) and (c) using a physical reference sample, the method further comprises monitoring the beam current used in the impinging particle beam of step (a). Likewise the method typically further comprises monitoring the beam current used in the impinging particle beam of step (b). In the case of a theoretical representation in step (a) the beam current should be monitored in accordance with step (b) as part of the second set of beam conditions, such that the first set are made identical to the second set or are related to the second set by calculation. When the first and second sets of beam conditions are different, most notably when the respective beam currents are different then the calculation of the output data is based upon the beam currents in accordance with the said first and second sets of beam conditions. Provided the incident beam position on the reference sample surface relative to the x-ray detector is substantially the same as that used for subsequent unknown sample measurements, the reference data can be obtained on a convenient material in a convenient configuration (without having to use grid bars or parts of the manipulator as will be described later).

If required in the method, the beam current may be monitored using a number of different techniques. For example a Faraday cup or conductive material may be used to directly measure the beam current. A probe current detector could comprise a flat piece of carbon opaque to the incident beam connected to an electrometer that measures absorbed current that is typically a constant and high fraction of the incident beam current. The beam current may be measured indirectly by placing the beam on a known material and measuring the electron signal from an electron backscatter detector.

The collected (monitored) x-ray signal is proportional to the product of collection solid angle and the incident beam current. Therefore, any proportional measure of beam current can be used to "calibrate" the system provided the same proportionality can always be achieved. The relative orientation between the beam, the reference or target sample and the x-ray detector are preferably held constant in the method, this preferably including using the same working distance. In particular the solid angle between the reference sample and the x-ray detector is substantially the same as that between the target sample and the x-ray detector since it is difficult practically to make an accurate evaluation of solid angle. It is not usual to have a known accurate estimate of collection solid angle although some measurement methods have been described in the literature. If the collection solid angle for the x-ray detector is known and the beam current can be measured, then the x-ray yield can be predicted from theory for any reference sample, without having to position the reference sample under the beam. In this case, the method can be performed with a single beam current measurement followed by steps (b) to (e) in accordance with the theoretical representation example of step (a).

The method provides the advantage of the sample being prepared in situ, in the same equipment within which it is measured, and without requiring calibration using a bulk standard of the same material as the sample, as is commonly required in the prior art. In other words, the method may overcome two of the disadvantages possessed by previously described methods of sample measurement and preparation, in that the measurement is made without any requirement for a calibration curve for the material of the sample, and that calibration, measurement and thinning may be performed without removing or inserting any samples.

The conversion of the x-ray yield recorded as monitored data into a thickness value for the target sample is facilitated by calibrating the impinging particle beam. This may be achieved by measuring the x-ray yield from a reference sample of known composition and either of known or bulk thickness.

Typically each of steps (a) to (e) is performed within the same apparatus. This may be in situ in the sense that steps (a) to (c) are performed within the same experimental session. The advantage of this method is that the first and second set of beam conditions may be assured to be constant, therefore removing the need to consider modulations in beam current in the calculation of the output data. It is preferred that the steps are performed within a common chamber of such apparatus. The invention therefore provides an advantage over the electron energy loss spectroscopy method of thickness measurement, as in contrast to this method the time consuming removal of the target sample from the apparatus where it is being prepared and measurement in a separate apparatus is avoided.

Preferably the steps (a) to (e) are performed within the same focussed ion beam scanning electron microscope (FIB-SEM). The use of such apparatus is advantageous in that an FIB-SEM comprises both an electron beam, which may preferably comprise the particle beam of the provided method, and a focussed ion beam with which the initial preparation of the target sample and the removing of materials from the target sample of step (e) may preferably be performed.

Typically each of steps (a) to (e) is performed in a vacuum environment.

The thickness of the region of the target sample may be reduced by a predetermined thickness according to the method. Alternatively or in addition, a thickness reduction value may be obtained whereby step (e) reduces the thickness of the region in accordance with both the output data and the obtained thickness reduction value. The obtained thickness reduction value may be dependent upon a previously monitored existent thickness of the region or may be a predetermined value in accordance with an iterative procedure. Thus the method may proceed by repeating steps (b) to (e) until the region has the predetermined thickness or the thickness of the region has been reduced by the obtained thickness reduction value.

In other words, a thickness measurement and the thinning of the target sample may be repeated in an iterative cycle that progressively reduces the thickness of the target sample until the desired thickness or reduction in thickness has been achieved. In such a cycle, the degree of thinning performed, that is, the amount of material removed, at each repetition of step (e), may preferably be guided by the thickness determined at the performance of step (d) that immediately preceded it. Similarly, each reduction in thickness may be guided by any or each of the recorded thickness measurements or known amounts of thinning that have been performed previously. The iterative process may alternatively be thought of as subsequent processing steps being guided by parameters including the measured thickness of the target sample. These parameters then guide the amount of milling that is prescribed for subsequent processing steps, with the change in sample parameters produced by the subsequent processing steps being calculated by the x-ray data produced thereafter.

Performing the method in such a way is advantageous in achieving the previously mentioned objectives of both preparing a sample that possesses a particularly desired or predetermined thickness, and preparing a sample containing a structure of interest that is neither so much thicker than the structure of interest that the structure of interest may be obscured nor so thin that the structure of interest is not fully contained in the prepared region of the target sample.

The method may be performed using an x-ray beam as the particle beam. However, preferably the particle beam is an electron beam. Thus the apparatus may comprise a scanning electron microscope (SEM) equipped with apparatus for removing the material in step (e). Such material removal may be effected by milling or cutting procedures, for example using a microtome. However, it is advantageous to use a focused ion beam in an FIB-SEM to perform this procedure, not least since the target sample may be formed initially from an original sample using such apparatus.

Depending upon whether the first and second sets of beam conditions are the same, the method may comprise using a beam in which one or each of the same beam energy, current or duration are applied to the reference sample and region of the target sample. These parameters provide examples of the beam conditions. The beam conditions may also include working distance and angle of incidence for example.

The output data are based upon each of the monitored data and reference data and optionally additional data concerning the beam conditions such as beam current. This output data are typically calculated in accordance with a model of the region of the target sample. The model may predict the x-ray spectrum produced by a specimen of known structure and composition being impinged upon by an electron beam of known characteristics such as the beam energy.

Typically the model is used to calculate a predicted k-ratio for one or more elements in the region of the target sample. The k-ratio of each element may be thought of as the ratio of the intensity of x-rays emitted by the element in the target sample to the intensity of x-rays emitted from a bulk pure sample of the element, when both samples are impinged upon by a particle beam having the same characteristics, for example using the same beam.

If the efficiency of the x-ray detector and the solid angle over which the emitted x-rays are collected are both accurately known, then the emitted x-ray intensities produced by a beam of known current or energy being directed to the sample may be calculated.

Typically the output data is calculated by way of comparing the predicted k-ratios to the k-ratios acquired from the monitored data. Thus, starting with an initial guess for the structure and composition of the target sample, the theoretical physical model may be used to predict intensities or k-ratios for the characteristic x-ray emissions. It will be appreciated that in many cases the model is adjusted iteratively. For example, the predicted data are compared, by way of a software program, to the measured x-ray yield in the monitored data, and the structure, or thickness and composition values with which the target sample specimen is being modelled are adjusted iteratively until the theoretical predictions are in conformity with the measured values.

The "calibration" measurement of reference data may be made by causing the particle beam to impinge upon the reference sample that comprises a bulk pure element. We note here that, whilst in some arrangements it may be advantageous that the reference sample comprises the same material as the target sample, there are other practical circumstances where this may cause spurious x-rays to be generated which become a source of error in the output data. Where required, the intensity for a different bulk pure element (from that of the reference sample) may be calculated from theory provided that the relative detector efficiency has been determined for a range of energies. Thus, for example the measurement with the beam on a piece of pure copper or pure silicon can be used to predict the intensity that would be obtained from a piece of pure gallium.

In one example of a model the target sample is modelled as layers on top of a substrate. The model may be modified to correspond instead to self-supporting layers having a vacuum beneath, that is on the exit side of the target sample, rather than a substrate. This arrangement may be effectively mimicked by configuring the model such that the substrate beneath the sample comprises beryllium. Beryllium is chosen since it is a light element that should only reflect electrons weakly, therefore in this way the multilayer theoretical model can be made to behave in the same way as the real situation wherein a non-scattering vacuum exists on the beam exit side of the target sample.

If the model is adapted to include layers the method may further comprise identifying the presence of one or more damaged layers in the region of the target sample using the monitored data.

Typically the damaged layer contains traces of contaminant material. Such contaminant material may have been implanted in the surface of the target sample by the focussed ion beam, and may therefore comprise materials used by the ion sources of such devices, most typically gallium, as well as helium, neon, gold and iridium, for example.

In such cases an additional objective of the thickness monitoring procedure is therefore to measure any implantation, for example by the focussed ion beam, or damaged layer that may have been created during the thinning process and which needs to be removed or taken into consideration during the analysis.

Preferably the damaged layer is removed from the region of the target sample in accordance with the output data. In other words, the process of removing material from the target sample, and the amount of thinning applied during this process, may be prescribed based upon the calculated thickness of the damaged layer acquired from the measured x-ray yield. The mass thickness of the material comprising the damaged layer, for example gallium, may therefore be used to guide subsequent processing, along with the thickness of the target sample itself. The processing subsequently carried out in order to reduce the thickness of the damaged layer may typically comprise using very low energy ion milling in the FIB or removing the target sample from the apparatus and using techniques such as low angle argon ion milling.

Preferably the reference sample is an elementally pure sample. As previously mentioned, calibration using a bulk pure element allows the theoretical calculation of x-ray yields for any other bulk pure elements.

It is preferred that the target sample has the form of a lamella. The lamella may typically have a thickness that is between 1 nanometer and 800 nanometers. The production of a sample having such a thin form is advantageous in that it may be electron transparent. Such lamellas may be used as samples for electron microscopy. The target sample in the form of a lamella is also advantageous to application in micro electromechanical systems (MEMS). As will be understood a lamella is a generally planar structure, with opposed extensive surfaces (these may extend in two dimensions or have a significant relative aspect ratio). Typically the thickness of the lamella (the distance between the opposed surfaces) is less than each of its other two dimensions. It will be further understood that whilst a lamella geometry is convenient, the method may be applied to other target samples having regions bordered by significantly thicker regions of regular or irregular shape. It is preferred that the region itself, as part of the target sample, has a substantially constant thickness.

The target sample may be formed from a protruding portion of an original sample, this portion remaining attached to the original sample and formed by removing material from parts of the original sample adjacent the target sample so as to form trenches around the protruding portion. For site specific preparation of a TEM sample a FIB-SEM is often used to prepare a thin lamella by milling trenches around an area of interest. The trenches are arranged in a way so that only a thin lamella is left standing which contains the area of interest. Depending upon the application and the technique used for analysis, the target sample, which will typically in this case be in the form of a lamella, may remain attached to the original sample or may be removed from the sample using a manipulator (using various milling and "welding" techniques). The monitoring of the thickness may be achieved on the region of the target sample in either a detached or an attached arrangement.

The reference sample may take a number of different forms, particularly where step (a) is performed separately from (either before or after) steps (b) and (c). Particularly in the case of an in situ method where such steps are performed as part of the same end-to-end session, typically the reference sample comprises a region of the original sample. It is possible to perform the calibration (obtain the reference data) upon a part of the original sample provided that the area chosen has dimensions sufficient to act as a bulk material in response to the particle beam. Such an arrangement is advantageous as it allows the calibration to be performed in close proximity to the monitoring of x-rays from the target sample, thereby facilitating a minimised delay between calibration and measurement of the region of the target sample.

In an alternative approach, the reference sample may be separate from and mounted near the target sample. Similarly, this arrangement permits quick and therefore effective calibration, while affording the user the ability to select, insert, remove or reposition the reference sample as appropriate. Indeed this also allows a different material to be used for obtaining the reference data.

The reference sample may be mounted on a probe (such as a manipulator) that can be inserted into, and retracted from, the vicinity of the particle beam.

Typically the target sample is mounted on a probe so that the target sample may be moved and reoriented relative to the particle beam. In such cases the reference sample may comprise a portion of the probe on which the target sample is mounted. Such an arrangement is advantageous in that it combines the freedom to reposition or adjust the target sample afforded by the use of a manipulator probe after lift out with the convenience for calibration that is possible due to selecting a reference sample that is proximal to the target sample.

The target sample may be mounted on an electron-transparent substrate, the electron-transparent substrate being mounted upon an electron-opaque structure. This is convenient for performing further analysis upon the target sample. In such cases the reference sample may comprise an area of the electron-opaque structure. An example of a further analysis technique is the application of transmission electron microscopy (TEM) which may take various forms. The electron-opaque structure in such a case may be a TEM grid whereby the reference sample comprises a region of a grid bar.

The use of such sample carrier grids is well known in the field and is advantageous to the method of the invention in that it provides a support structure for the target sample whilst being easily incorporated into the theoretical model used for thickness determination, and in that it contains components such as grid bars which may provide convenient, proximal regions of known composition which are suitable for use as a reference sample.

Of course other sample carriers may be used. For example the target sample may be mounted on a post of a sample carrier and wherein the reference sample comprises a region of the post of the sample carrier. Thus an alternative arrangement is provided wherein the target sample such as a lamella may be welded to a post so that it is not supported by a film. Performing the calibration using the material of the post again constitutes the selection of a convenient and suitable reference sample.

The thin nature of the region may mean that the particle beam not only impinges upon the target region itself but also travels through it and interacts with other materials. This may generate spurious x-rays which act as a source of error within the method. When the particle beam causes the generation of spurious x-rays in material other than the target sample, the method may further comprise absorbing the particle beam when it has exited the region of the target sample. Thus some form of material may be positioned so as to absorb the beam and prevent at least x-rays of similar energies to those from the target region, from reaching the x-ray detector. The method may therefore further comprise absorbing the particle beam using either, part of a probe formed from a material different from the target sample, or, a shield material held by a probe, the shield material being formed from material different from that of the target sample (and from parts of an original sample, such as surfaces of trenches, where present). Using a shield material held by a probe allows the selection of a shield that possesses particular thickness, dimensions or composition to be suited to the specific embodiment or original sample geometry.

Such techniques may be particularly advantageous when analysis is carried out with the lamella remaining attached to the original sample between milled trenches. In the case of an electron beam (by way of example), electrons that are transmitted through or scattered out of the lamella may, in such an arrangement, subsequently enter the sidewalls of the milled trench, which are composed of the same material as the target sample. This results in the generation of x-rays whose characteristic spectrum is similar to that generated within the target sample. This spurious radiation may therefore be erroneously collected by the detector and included in the thickness determination calculation if steps are not taken to prevent it. Furthermore this unwanted radiation may not easily be prevented from being collected by adjustment of a local geometry or sample orientation. As an alternative to the use of a probe this problem may be addressed by applying a shielding layer of material to a trench on an exit side of the target sample (or indeed to any part of the original sample which may receive the particle beam), the shielding layer being formed from a material different from the target sample (and indeed the original sample). The shielding layer may be deposited using gas injection and deposition techniques.

An alternative solution to remove spurious x-rays is to ensure that the region of the target sample is dissimilar from nearby material, including other parts of the target sample. In this case it is preferred that the target sample is formed from a part of an original sample, wherein at least the said part of the original sample is coated with a second material, said second material being different from the material of the original sample, such that part of the target sample is formed so as to comprise the second material, the part of the target sample formed from the second material being of substantially the same thickness as another part of the target sample; and wherein the said region of the target sample is formed from the second material. For example in the case of a target sample comprising a lamella, the end of the lamella may be formed from a region or similar thickness and yet of different (second) material.

In this case, the second material may be applied as an additional layer and should be composed of a material different from those otherwise present in the proximity of the beam. Platinum, carbon and tungsten are suitable examples of such a second material, particularly when using semiconductor materials as the target sample. The second material may be deposited onto the surface, that is the top of, the original sample from which the lamella is to be formed. The deposition may be carried out by injecting a gas close to the sample surface and decomposing it using an electron or ion beam. Once the lamella has been formed, the thickness of the top layer will be the same as that of the lamella and may be determined by the previously described approach, adjusting the theoretical model accordingly and comparing the predicted results with x-ray emissions from the additional layer.

BRIEF DESCRIPTION OF THE DRAWINGS

Some examples of methods and apparatus according to the invention are now described, with reference to the accompanying drawings, in which:

FIG. 17 is a table containing the results of the thickness calculation performed in the eighth example method;

FIG. 21*a* shows the blocking of transmitted electrons using a probe in accordance with a ninth example method;

FIG. 21*b* shows the x-ray measurement of an additional layer of material applied to the top surface of the target sample in accordance with a twelfth example method;

FIG. 22 shows the original sample of the twelfth example method, having had an additional layer of material applied to its surface and subsequently, having been milled so as to form a lamella, and a side on cross section of this subsequent form.

DESCRIPTION OF EMBODIMENTS

Figure 1:
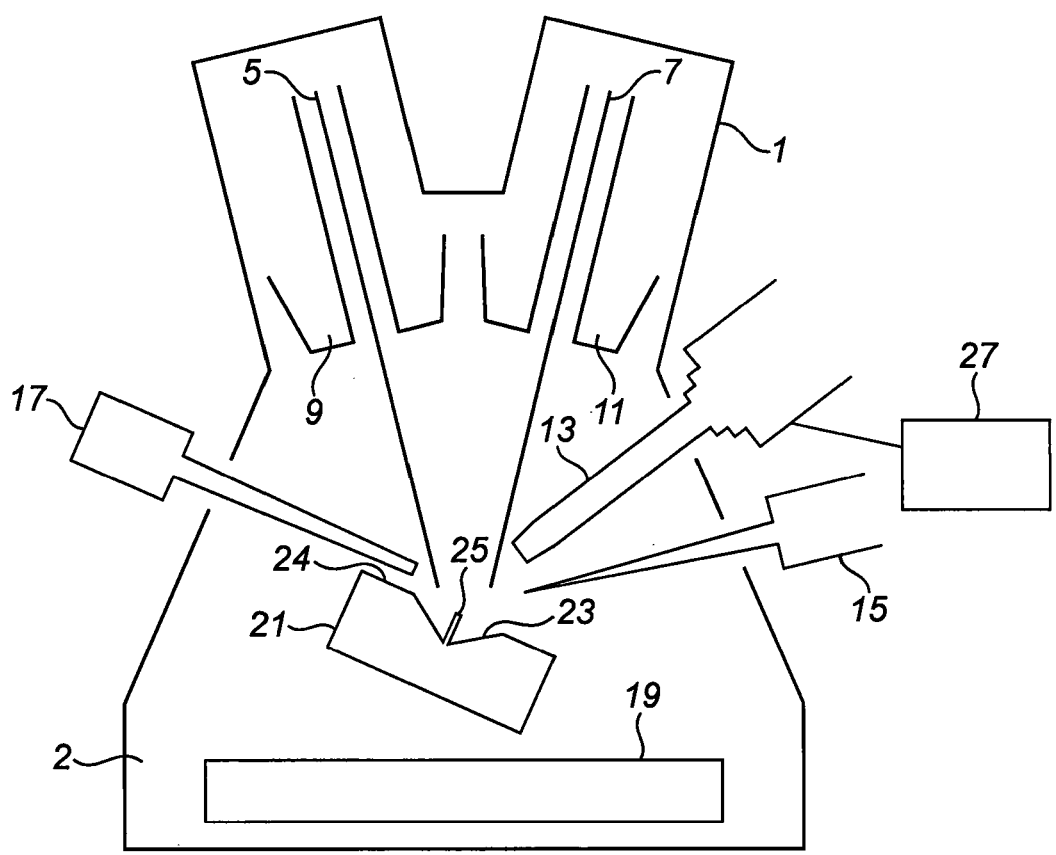
FIG. 1 is a schematic illustration of a focussed ion beam scanning electron microscope apparatus for performing the claimed method.

Apparatus suitable for the implementation of the method is described first. A schematic diagram of the apparatus is shown in FIG. 1. The apparatus comprises a focused ion beam scanning electron microscope (FIB-SEM) 1. As is known in the art the FIB-SEM comprises a vacuum chamber 2 containing an electron beam 5 and an ion beam 7, and the required electron optics 9 and ion optics 11 for focussing and scanning with the beams, respectively. The vacuum chamber also contains a sample stage 19, and side ports to hold a manipulator 15, a gas injection system 17 and an x-ray detector 13. The apparatus is controlled by a computer having a processor 27, this processor also receiving signals from the x-ray detector 13. Upon the sample stage 19 is positioned an original sample 21 which contains an area of interest. This original sample 21 comprises a target sample in the form of a lamella 25, trenches 23, formed by the removal of material from the region of the original sample surrounding the target sample and a reference sample 24 which in this embodiment comprises a part of the original sample 21 having dimensions sufficient to act as a bulk material in response to the electron beam 5. As will be understood the target sample may be formed from the original sample 21 using ion beam milling in the FIB-SEM according to known methods.

The target sample 25 may be moved, tilted and rotated with respect to the vacuum chamber 2 such that electron beam 5 may be caused to impinge upon the target sample 25 without being obscured or blocked by other parts of original sample 21. X-rays are produced within the lamella 25 by incident electron beam 5. X-ray detector 13 is directed towards the lamella, and is positioned near to the lamella such that the solid angle over which the produced x-rays radiating from the lamella are detected by the detector 13 is maximised.

Figure 5:
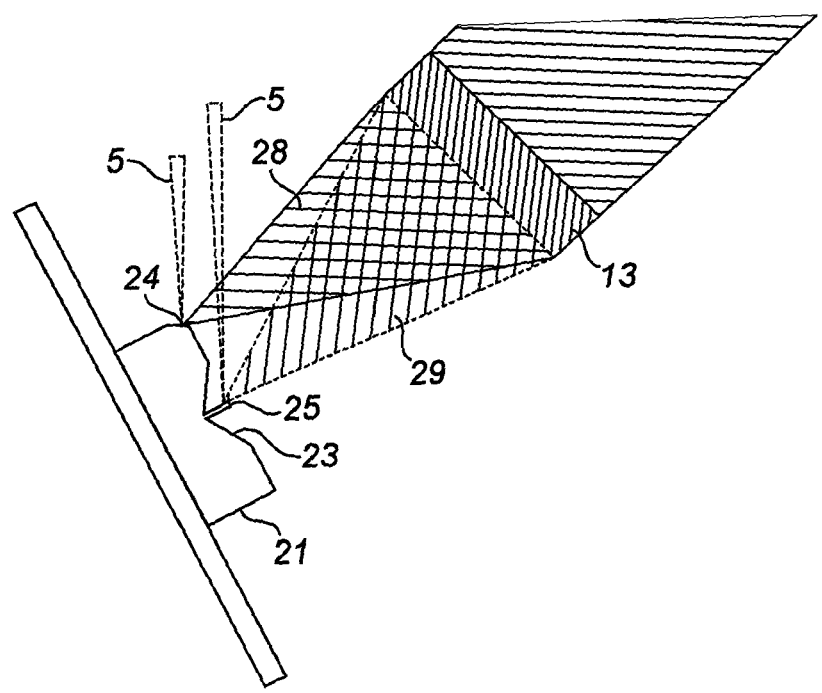
FIG. 5 shows the x-ray measurements of the reference and target samples in the first example method.

FIG. 5 further illustrates the arrangement of apparatus within vacuum chamber 2 in accordance with the present embodiment. The schematic depicts target sample lamella 25 being still attached to original sample 21, and being tilted with respect to electron beam 5. The figure depicts the electron beam 5 first being focused onto the calibration sample 24, which is a selected suitable surface of the original sample 21, and subsequently focussed onto the lamella 25. While the solid angle over which excited x-rays emitted from the reference sample 24 and the target sample 25 respectively (28, 29) appears to be different, this is for illustrative purposes only and in reality the solid angle between the target area of each sample and x-ray detector 13 would be the same.

An example method of the invention is now described for an in situ method. It will be understood that this method may be modified readily to effect the separation of the monitoring of the reference sample from that of the target and thereby include a consideration of different beam conditions in the calculations for guiding the "thinning" process. Indeed, if the necessary effort is expended to determine reference data representing the effective collection solid angle and efficiency for the x-ray detector that correspond to an available measure of beam current, then the physical monitoring of the reference sample can be avoided.

Figure 2:
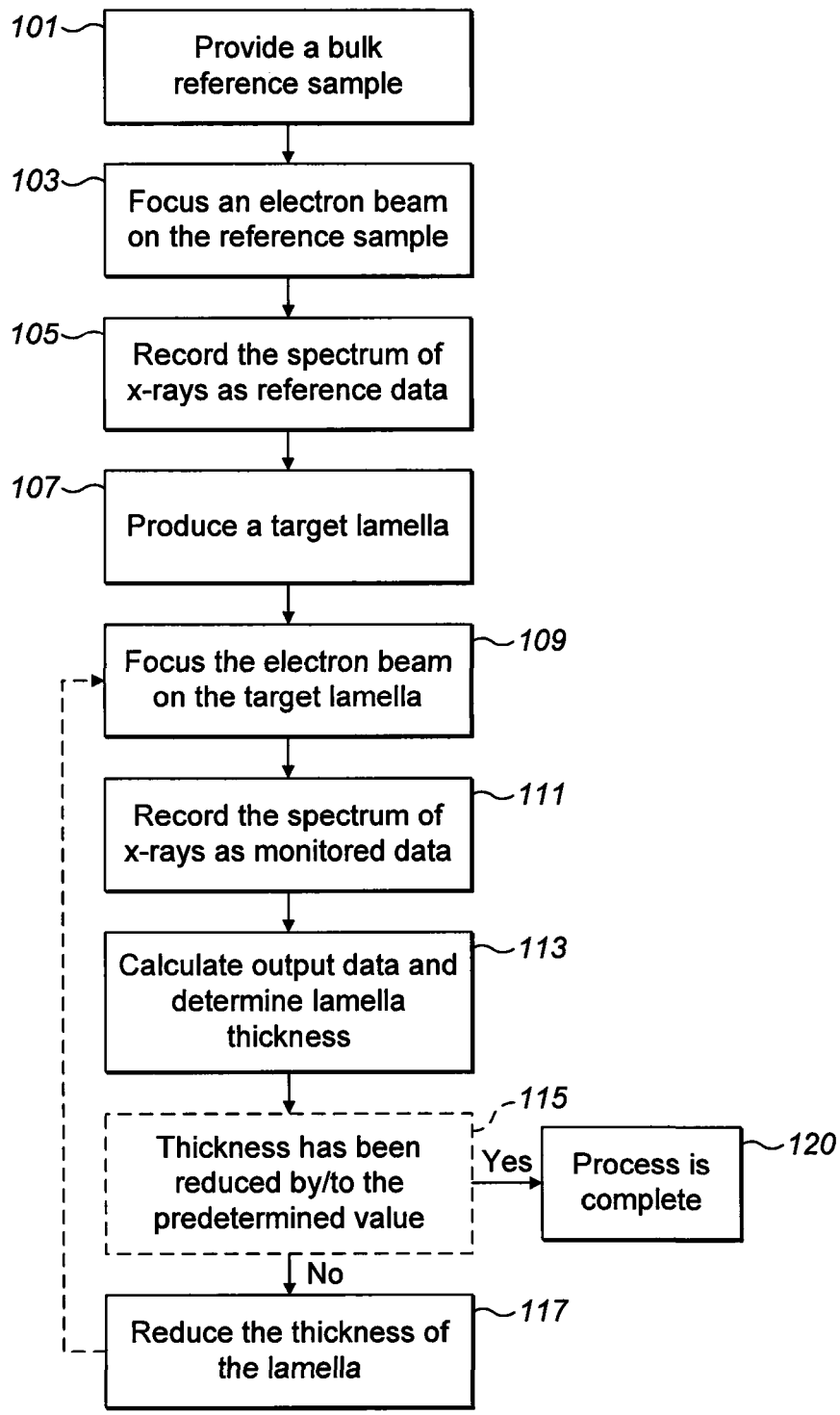
FIG. 2 is a flow diagram illustrating a first example method according to the invention.

Referring now to FIG. 2, the method begins at step 101 in which a reference sample 24 having a predetermined composition and dimensions sufficient to act as a bulk material in response to an electron beam, is provided. In the embodiment depicted by FIG. 1, a region of the original sample 21 is provided as the reference sample 24. Notably at this stage the original sample is in an unmilled state. In this case the region chosen is of known composition and presents to the electron beam 5 a region of material having sufficiently large dimensions so as to be able to contain the entire volume within which x-rays are produced due to interactions between the sample material and the incident electron beam.

At step 103 the electron beam 5 is then focussed upon part of the reference sample 24 by first positioning the original sample such that the electron beam 5 coincides with the chosen part of the reference sample. The incident beam causes x-rays to be produced by the excitation of electrons within the reference sample.

X-ray detector 13, which is positioned so as to maximise the proportion of the produced x-rays that are detected, collects the x-rays generated by the interaction between the electron beam and the reference sample. The spectrum of the produced x-rays is recorded at step 105, to produce reference data according to the spectrum of x-rays generated by the interaction between the electron beam and the reference sample.

At step 107 the target sample 25 is milled from the original sample 21. A focussed ion beam 7 is used to mill trenches around an area of interest in the original sample 21. Material is removed from the original sample 21 in this way so as to form a trench 23 from the bottom of which a thin lamella 25 protrudes, the lamella containing the area of interest. The shape of the trenches 23 is configured to enable a line of sight to be established between the electron beam 5 and the lamella 25 from a range of angles, unobscured by the sidewalls of the trenches so that electrons of electron beam 5 are incident only upon the lamella 25 and not on any other part of the original sample 21.

Electron beam 5 is then focussed upon part of the lamella 25 at step 109. Electron beam 5 is configured to impinge upon each of the reference sample and target sample with the same beam energy and such that an identical beam current is incident upon each of the reference sample and the target sample. In the embodiment illustrated at FIG. 1 the lamella 25 is tilted with respect to the electron beam. A direct line of sight from the area of the lamella within which x-rays are generated and the x-ray detector is possible due to the size and width of the trench 23. At step 111 x-ray detector 13 collects the x-rays generated by the interaction between the electron beam and the target sample in the form of lamella 25. The spectrum of these x-rays is recorded to produce monitored data.

At this stage two data sets of x-rays have been recorded, namely, monitored data that contains the recorded spectrum of x-rays generated within the target sample, and, reference data containing the recorded spectrum of x-rays generated within the reference sample. These sets of data are compared at step 113 in order to calculate output data, which contains the determined thickness of the lamella 25.

In the current embodiment, the thickness of the region of the target sample is to be reduced to a predetermined thickness by the method of the invention so as to enable further materials analysis or some other desired use. This is achieved by way of an iterative process wherein the thickness of the lamella is reduced and then measured, repeatedly until the lamella has been thinned to the predetermined thickness. An example thickness is 50 nanometers. This is illustrated at step 115 in FIG. 2, wherein the subsequent step of the method is determined by whether the thickness has been reduced by, or to, a predetermined amount. If the thickness of the lamella, as determined in accordance with the output data, is the desired thickness, then the process is complete (step 120). If the determined lamella thickness remains greater than the predetermined desired thickness, then material is removed from the lamella 25 so as to reduce the thickness of the lamella further, at step 117. In the current embodiment, the lamella 25 is milled using ion beam 7 so as to remove material from the lamella 25 and reduce its thickness. The amount of milling carried out at this step is guided by the difference between the predetermined objective lamella thickness and the thickness that is determined from the output data.

When the milling of stage 117 is complete, the process then returns to step 109 wherein the electron beam 5 is again caused to impinge upon the target sample 25.

Figure 3:
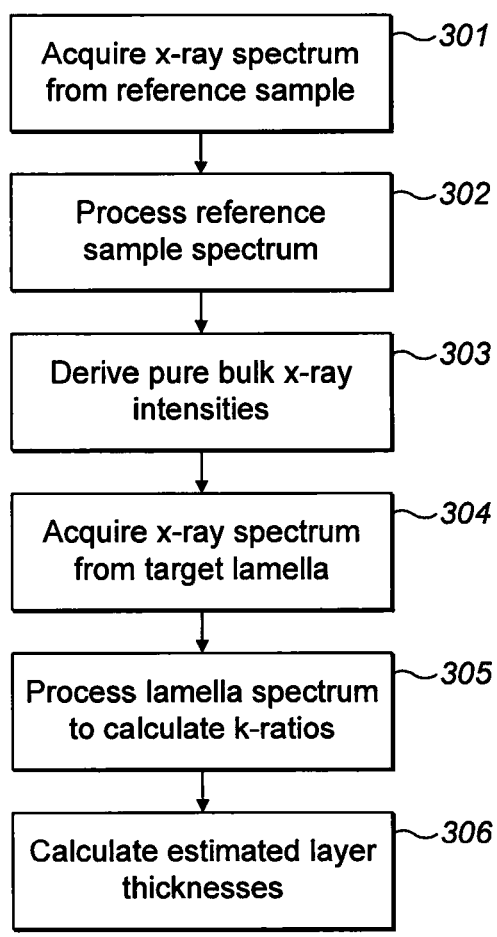
FIG. 3 is a flow diagram illustrating the analysis process of the claimed method.

FIG. 3 provides further details of the x-ray analysis steps previously shown at 103, 105, 109, 111 and 113. Referring now to the flow chart at FIG. 3, at step 301 a spectrum of x-rays is acquired by focussing a 20 kV electron beam on the reference sample and recording the x-rays produced over a known period of time. The recorded spectrum is used at step 302 to determine the k line intensity for the reference sample material in units of photons per second.

At step 303 the x-ray intensities that would have been obtained from pure bulk samples of the elements of interest within the target sample are derived. This deduction is made either from previous measurements on pure standard materials comprising the elements of the reference and target samples using the same detector, or from theoretical predictions.

The electron beam is then focussed upon the lamella at step 304, while keeping the energy and current of the electron beam unchanged. At 305 x-ray intensities for the elements of the target sample are obtained in units of photons per second from the spectrum acquired at step 304. These intensities are then converted, using the bulk element intensities derived at step 303, to experimental k-ratios.

At step 306 an iterative calculation (see FIG. 4) is performed by computer software to calculate best estimates for the thicknesses of the elements of interest within the target sample layers that would generate k-ratios consistent with those experimental k-ratios obtained at step 305. Thereafter at step 306, the target sample can be thinned further, in accordance with the calculated thickness, as per step 117.

Figure 4:
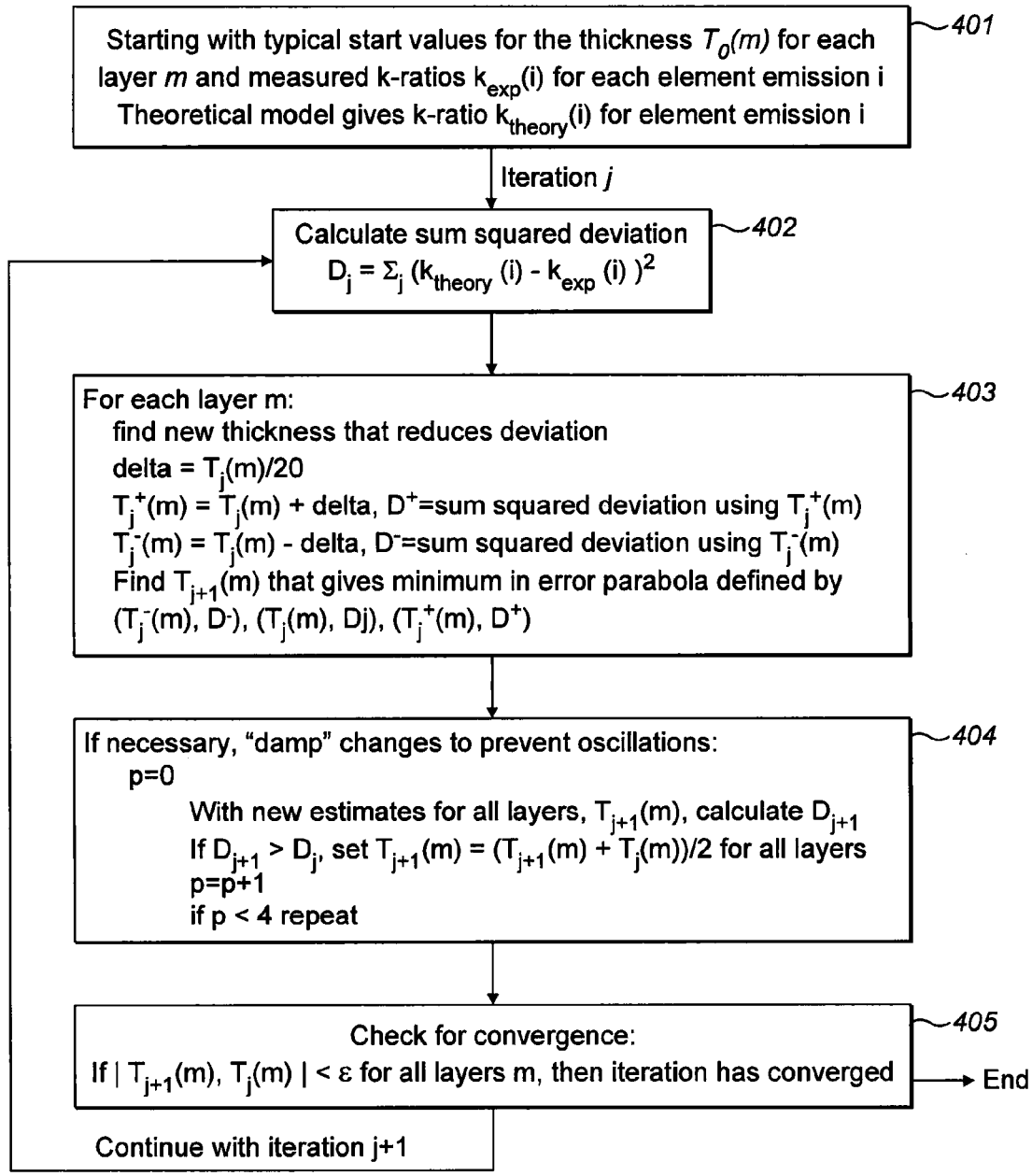
FIG. 4 is a flow diagram illustrating the thickness calculation process of the example method.

The flow diagram of FIG. 4 illustrates the iterative procedure performed at step 306 by which the thickness of each layer of the target sample is calculated. Starting at 401, an initial thickness value $T_0(m)$ is assigned to each layer m of the lamella. For each element i within the lamella that produces k level x-ray emission lines, the experimental k-ratio $k_{exp}(i)$ as obtained at 305 and theoretical k-ratios, modelled in accordance with theory, $k_{theory}(i)$ (see for example J. L. Pouchou. "X-ray microanalysis of stratified specimens", Analytica Chimica Acta, 283 (1993), 81-97)) are also taken as starting parameters. The iterative process then begins for the initial value of iteration index j. The cycle begins at step 402 with the calculation of the sum squared deviation $D_j$. The procedure at step 403 is then performed for each layer m. The thickness value $T_j$ for the current iteration step j is used to pursue a minimum sum squared deviation. Taking $T_j(m)/20$ as a convenient value for delta, this value is added to, and subtracted from, $T_j(m)$ to give $T_j^+(m)$ and $T_j^-(m)$, respectively. The thickness value that corresponds to the minimum in the parameter defined by the three points $(T_j^-(m), D^-)$, $(T_j(m), D_j)$, $(T_j^+(m), D^+)$, where $D^+$ and $D^-$ are the sum squared deviations calculated using $T_j^+(m)$ and $T_j^-(m)$, respectively is assigned as the starting thickness value $T_{j+1}(m)$ for each given layer m for the next iteration cycle j+1.

The estimation of the thickness value is deemed to have converged when $T_j$ is stationary within a certain threshold sigma. The check for convergence is made at step 405, wherein if the difference between the thickness $T_j$ for the current iteration step j and the determined thickness $T_{j+1}$ for the next iteration step j+1 is less than sigma for each of the layers m then the cycle is complete. In the case that $T_{j+1}(m)-T_j(m)$ is greater than or equal to sigma for any of the layers m, then the cycle is repeated and iteration continues with step j+1, returning to step 402.

Within each iteration step, a method of oscillation damping is applied at step 404 in order to prevent the estimated thickness from oscillating about the convergence value. This is achieved by assessing the deviation $D_{j+1}$ for the new thickness estimate for each layer $T_{j+1}(m)$, and in the case that $D_{j+1}$ is greater than the deviation $D_j$ for the current iteration step j, setting the thickness value $T_{j+1}(m)$ for the next step to be the mean of the current thickness $T_j$ and the thickness $T_{j+1}$ of the next step. This damping factor is applied up to four times in repetition, by way of assigning an initial value of zero to index p, incrementing p by 1 for each application of oscillation damping to the estimated thickness and repeating 404 for the case when p is less than 4. Note that k-ratios are used to avoid the need to determine x-ray detector collection solid angle and efficiency and the need to measure beam current explicitly. If beam current measurement is available and collection solid angle and efficiency have been pre-determined, then either the intensities corresponding to pure bulk elements can be predicted so that sample intensities can be converted into k-ratios or the iteration scheme can be modified to use the measured x-ray intensities in place of measured k-ratios and a theoretical prediction of x-ray intensity, rather than a prediction of k-ratio within the scheme.

Figure 6:
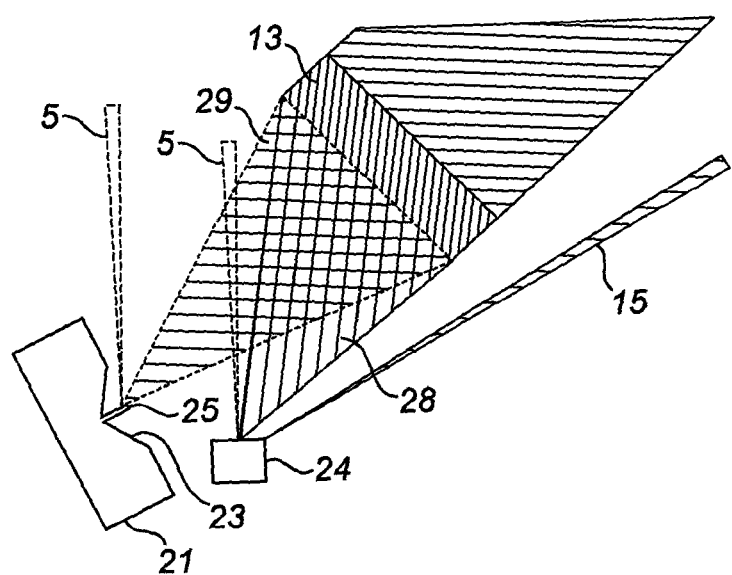
FIG. 6 shows the x-ray measurement of the reference and target sample in a second example method.

FIG. 6 depicts a second embodiment of the invention wherein rather than selecting part of original sample 21 as the reference sample 24, the calibration is performed upon a physically separate reference sample 24 that is mounted on a probe of a manipulator 15 which may be inserted and retracted from the FIB-SEM or SEM chamber. For this embodiment and the other embodiments now described the method is the same as for the first embodiment unless indicated to the contrary.

Figure 7:
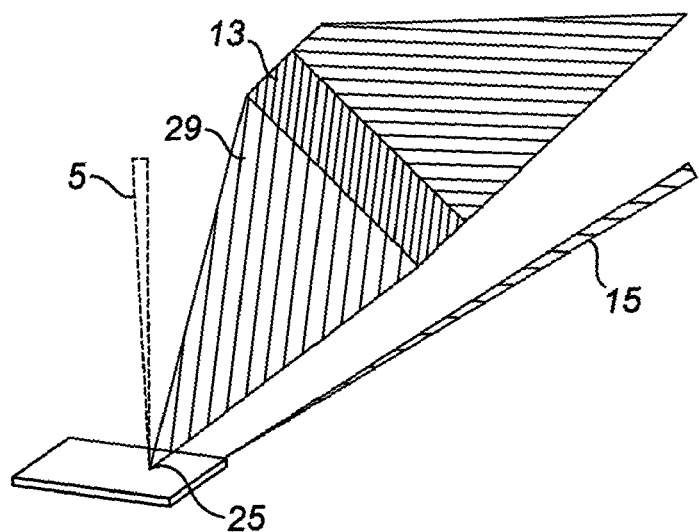
FIG. 7 shows the x-ray measurement of a target sample that is mounted on a probe, in accordance with a third example method.
Figure 8:
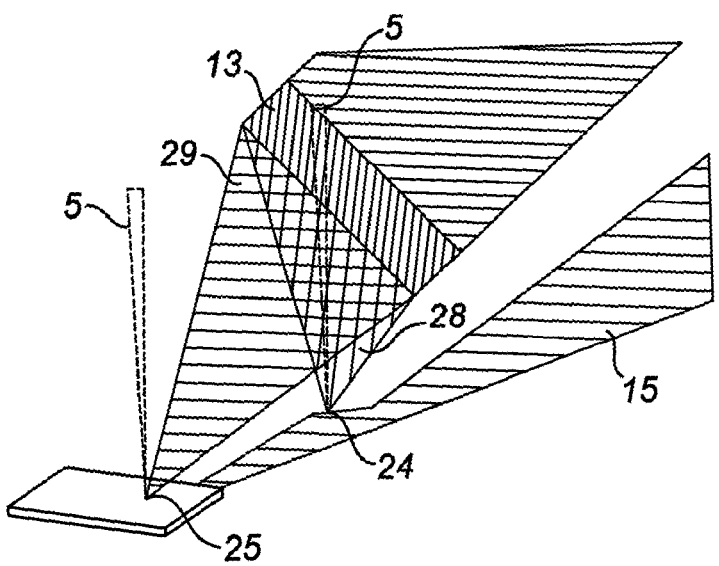
FIG. 8 shows the x-ray measurement of the target and reference sample in the third example method.
Figure 9:
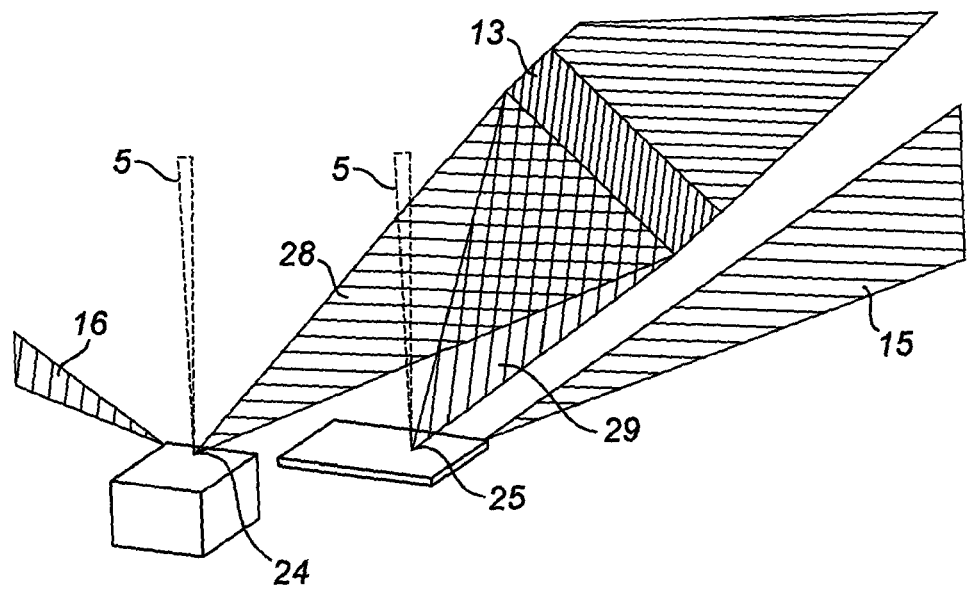
FIG. 9 shows an alternative arrangement for the x-ray measurement of the reference sample.

FIGS. 7 and 8 present another alternative arrangement of both target sample 25 and reference sample 24, in accordance with a third embodiment of the invention. In this embodiment, after being prepared using one the methods known to those skilled in the art (for instance by milling trenches using an FIB), the lamella 25 is attached to a manipulator 15, and lifted out of the trench. The probe enables free movement of the target sample within the chamber and allows reorientation of the lamella with respect to the electron beam. Additionally, a suitable area on the manipulator probe itself may be used, illustrated at FIG. 8, to calibrate the measurement. A beam calibration measurement is performed by acquiring an x-ray spectrum from the selected area of the probe 24 which is of known composition. The manipulator is then moved and rotated such that the lamella is under the electron beam 5 and the electron beam is positioned on the side of interest upon the prepared lamella. Alternatively, the reference sample 24 may be inserted on a second probe 16 as per the second embodiment, and as illustrated in FIG. 9, rather than using an area of the (first) probe of manipulator 15 for calibration. As explained earlier, in the event that the probe material is different from that of the lamella 25, the reference data may be converted to be equivalent to that of the material of the lamella 25.

Figure 10:
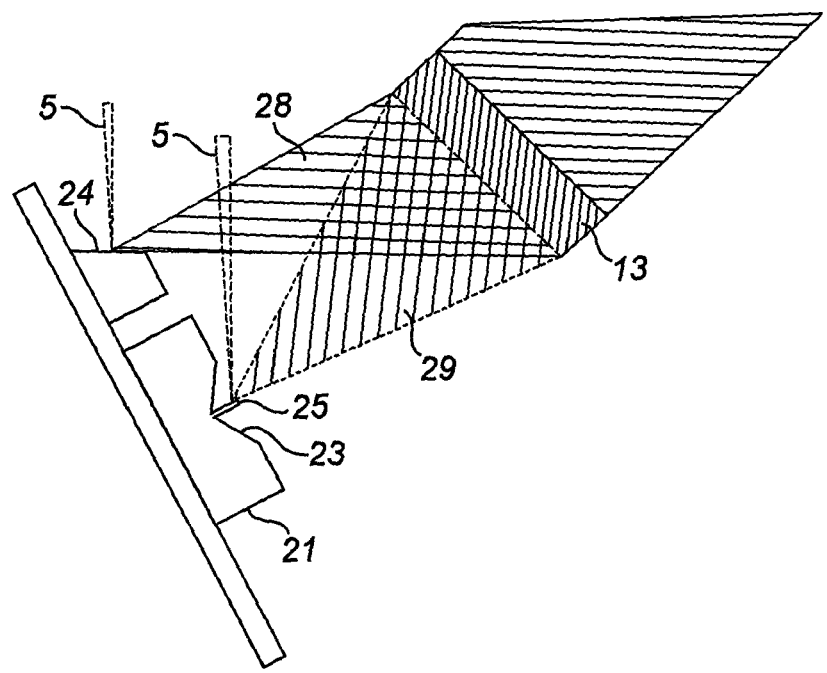
FIG. 10 shows the arrangement of the reference sample, original sample and target sample in accordance with a fourth example method.

A fourth embodiment comprises a separate reference sample 24 being mounted to the sample stage 19 near the target sample 25 within the FIB-SEM chamber. An example of such an arrangement is illustrated at FIG. 10. Positioning the reference sample 24 in close proximity to the lamella 25 allows the calibration measurement and target measurement to be carried out in quick succession, thereby facilitating the beam current to be kept constant between calibration and measurement of the lamella and ensuring that the calibration is effective.

Figure 11:
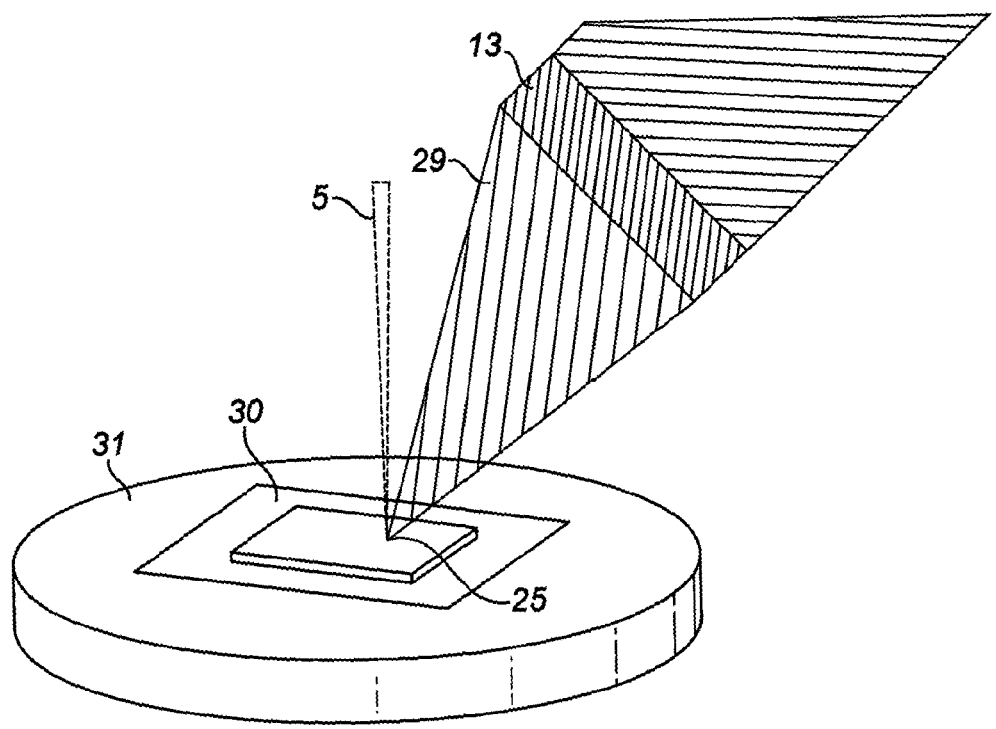
FIGS. 11, 12 and 13 show the mounting of the target sample upon a carrier grid in accordance with a fifth example method.
Figure 12:
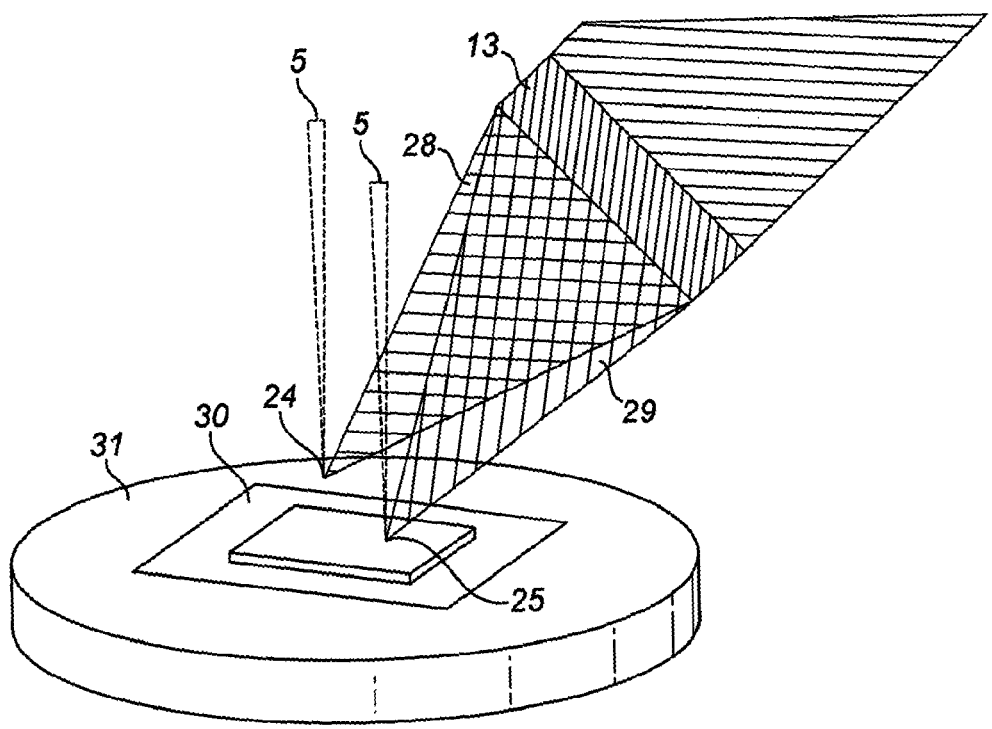
Figure 13:
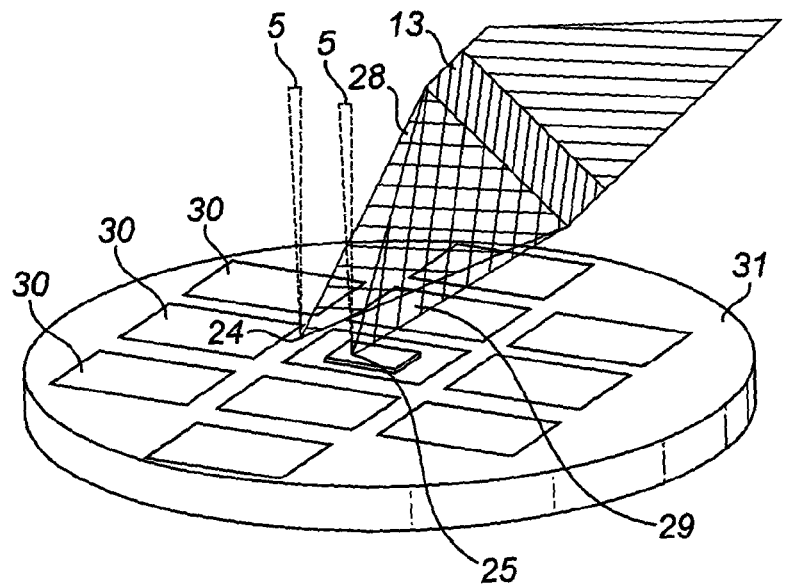
Figure 15:
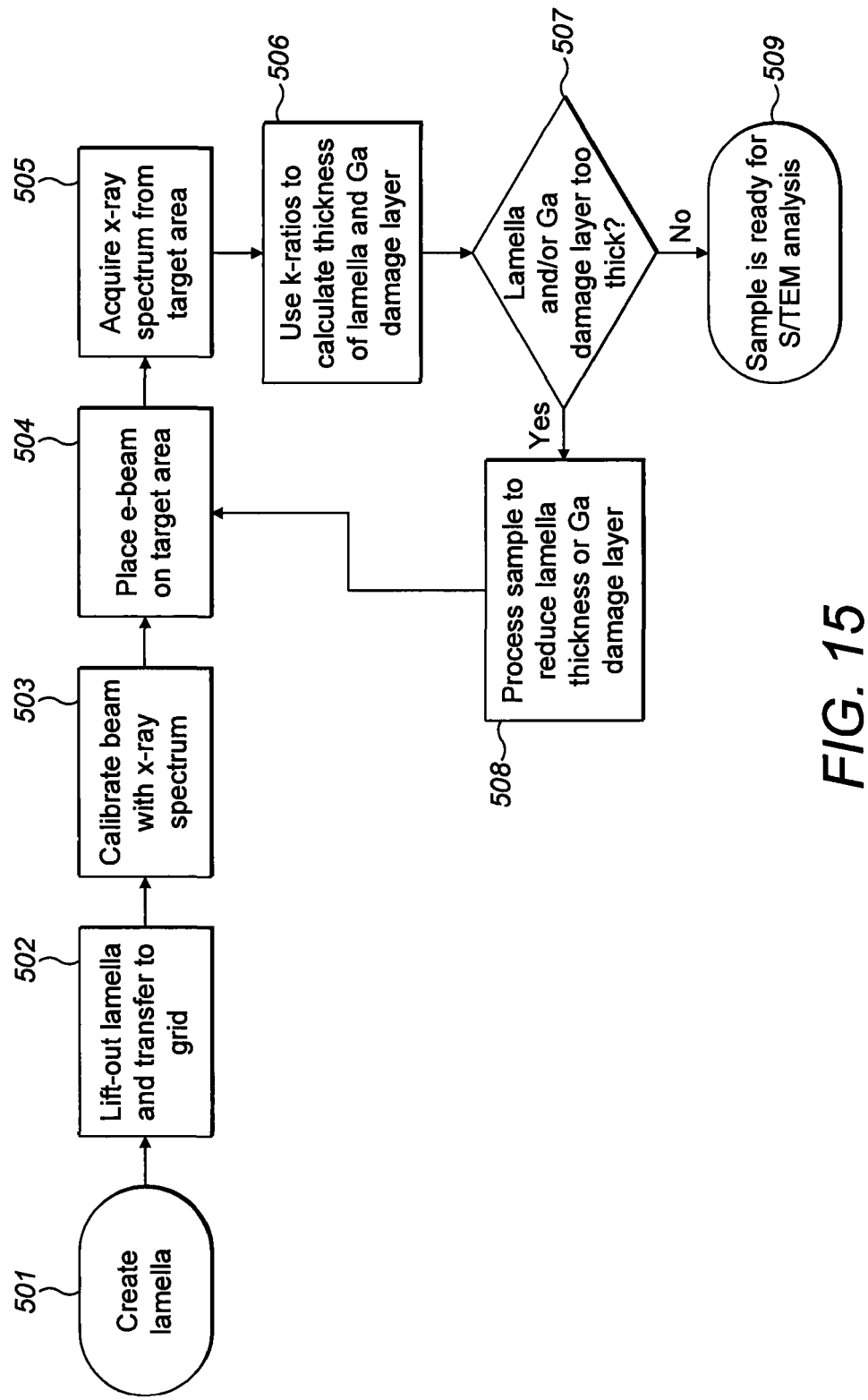
FIG. 15 is a flow diagram illustrating an eighth example method.

In a fifth embodiment the method of the invention is performed with the lamella 25 having been transferred onto an electron-transparent substrate in the form of a film 30, as illustrated in FIGS. 11 and 12. The electron transparent film 30 upon which target sample 25 sits may be formed for instance of thin amorphous carbon. With reference to the figures, film 30 is formed on a carrier, known within the art as a "grid", the carrier having large regions which are electron transparent and other regions which are electron opaque 31. An example of the abovementioned grid structure is depicted in FIG. 13. In this example, the grid contains a multiplicity of fields of electron transparent film 30. Calibration of electron beam 5 may be performed, in the current embodiment, using a non-electron transparent region 31 of the grid as the reference sample 24. With particular reference to FIG. 15, wherein the carrier takes the form of a grid with multiple, orthogonally intersecting, grid bars surrounding regions 30 of electron transparent film, a grid bar close to the field 30 that contains the lamella 25 may be used for calibration. Measurement performed as per the current embodiment requires the software performing the measurement to calculate the emission for layers corresponding to the lamella 25 on top of a layer corresponding to the support film 30. The grid is usually formed from copper.

Figure 14:
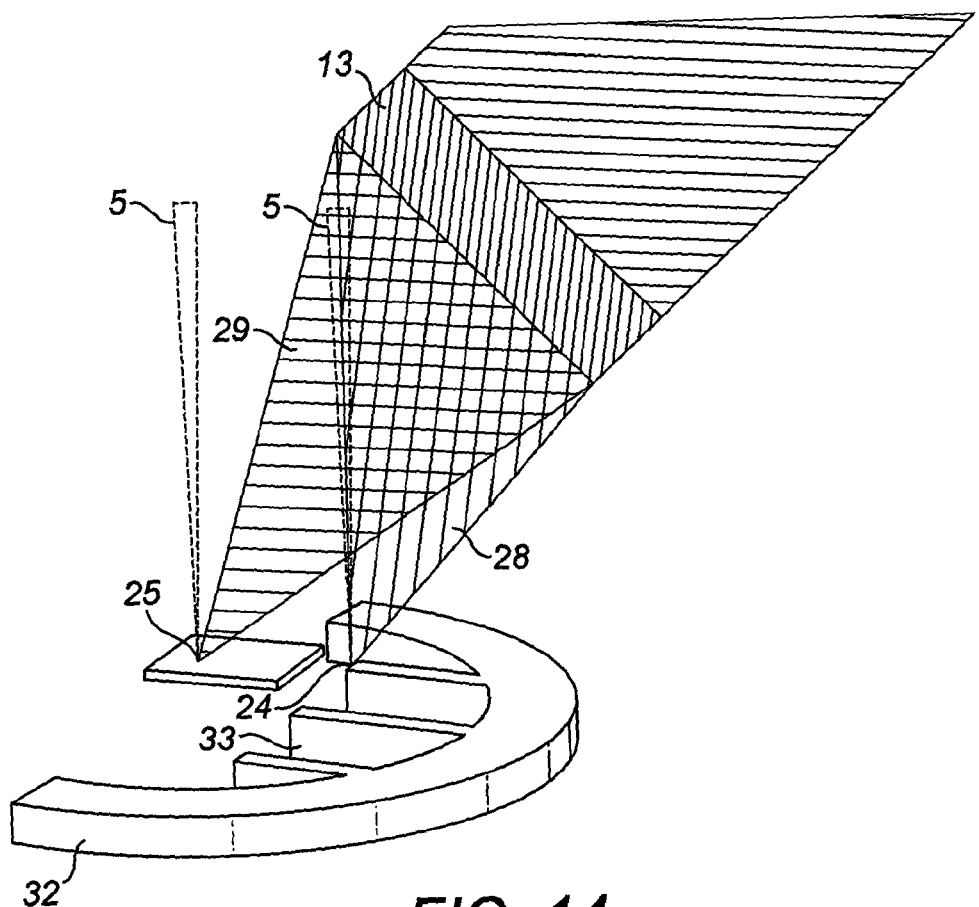
FIG. 14 shows the mounting of the target sample upon a carrier post in accordance with a sixth example method.

A sixth embodiment represents a further alternative for mounting the target sample after it has been lifted out from original sample 21. With reference to FIG. 14, the lamella 25 is welded to a post 33 instead of being supported by a film or substrate. In the current embodiment the material of carrier 32 is suitable for the calibration of electron beam 5, therefore a region of the post 33 to which lamella 25 is welded is selected for use as reference sample 24.

A seventh embodiment comprises performing the method in accordance with any of the previous embodiments, except that an x-ray beam is used instead of electron beam 5 to excite x-rays within the samples 24 and 25 and thereby allow the measurement of the thickness of the target sample.

In an eighth embodiment, the method of the invention includes the identification, thickness measurement and removal of one or more layers of damaged material on the target sample. This may be particularly applicable to any embodiment where ion beam milling is used to form or thin the lamella. In this case, the focussed ion beam that is used to mill the trenches 23 around target sample 25 implants some of its constituent gallium ions into the surface of the lamella 25. The surface layers of the lamella, the atomic structure of which has been amorphised by the gallium ion implantation, are removed as part of the material removal stage of the present embodiment of the invention method. Practically this is may be achieved by modifying the parameters that control the ion beam milling process.

The flow diagram of FIG. 15 illustrates this further. First, at step 501 similarly to the fifth embodiment, lamella 25 is prepared by milling trenches using the FIB on either side of the lamella from an original sample 21 (which may be composed of silicon for example), and the lamella is lifted out the trench and placed on a suitable TEM grid 31 at step 502. A beam calibration measurement is then carried out at step 503 by acquiring an x-ray spectrum from a reference sample 24 having a known composition. At step 504 the lamella 25 is positioned under the electron beam 5 and the electron beam is focused on the site of interest on the prepared lamella. At step 505 an x-ray spectrum is acquired from the sight of interest on the prepared lamella 25. The recorded x-ray spectrum is then processed at step 506 to measure the intensity of the silicon and gallium k line emissions from the spectrum and obtain k-ratios using the deduced intensities for pure bulk silicon and gallium, using these to calculate the thickness of the lamella and the effective thickness of the gallium layer. The computational process to determine the thickness of the layers is performed by applying to the lamella a theoretical model wherein the layers comprise a beryllium substrate, a silicon layer and a layer containing gallium and silicon with a composition of 10% atomic gallium. In this example the damaged (amorphised) layer is assumed to be, and is modelled as being, on one side of the lamella only and is approximated as a $SiGa_x$ compound. This modification of the model to include a beryllium substrate, as opposed to one that corresponds to self-supporting layers with a vacuum beneath them is chosen so that the multilayer theoretical model mimics the real situation with a non-scattering vacuum on the beam exit side of the lamella, given that the light element beryllium would only weakly reflect electrons.

The determined thicknesses of the silicon and damaged layers then guide the process at step 507. In the case that the desired lamella and damaged layer thickness have been achieved, the process proceeds to step 509 and the lamella may be lifted out and transferred to a TEM grid. Should the lamella thickness be too great the process instead continues to step 508, wherein the sample is processed further to reduce the thickness of the lamella, similarly to the first embodiment. Additionally, should the lamella thickness be determined at step 507 to be close to the desired value, albeit with the thickness of the gallium damage layer being too great, the indication is that there is significant amorphisation of the lamella surface and this surface damage is removed for instance by low kV milling at step 508.

Figure 16:
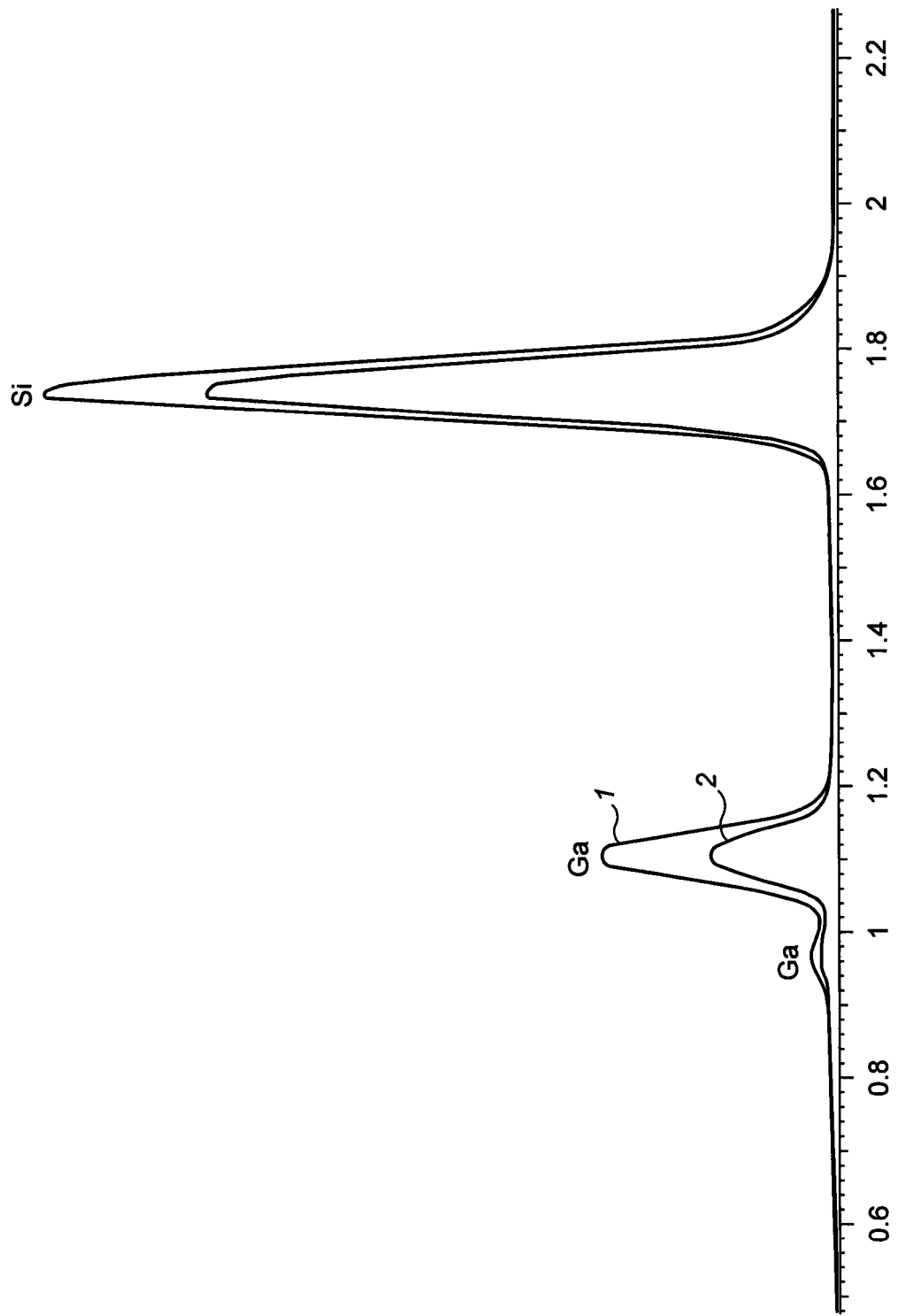
FIG. 16 is a graph displaying the acquired x-ray spectra from the target sample both before and after the thinning of the sample in accordance with the eight example method.

The process through steps 504 to 507 is then repeated until the desired lamella and damage layer thicknesses have been achieved. FIG. 16 shows a first x-ray spectrum acquired from a target sample prior to the thickness reduction at step 508, overlaid with a second spectrum obtained from the same sample with the same electron dose after having removed material from the sample at step 508. The reduction in signal intensity from the silicon peak is indicative of the reduction in thickness of the lamella, while the reduction in the height of the gallium peak shows that the gallium damaged layer has also been reduced in thickness.

The quantitative results of the thickness calculation procedure as applied to the current example are shown at FIG. 17. In this case, the result of the analysis of the first and second x-ray spectra acquired from the target sample indicates that the thickness of the damaged layer is 20 nanometers and the thickness of the undamaged layer is 47 nanometers prior to reaching step 507. The second x-ray spectrum, recorded for 30 seconds subsequent to the second thinning step at step 508, is processed to show that the gallium silicon layer is thinner by approximately 10 nanometers whereas the undamaged silicon layer is unaffected and remains at 47 nanometers.

Figure 18:
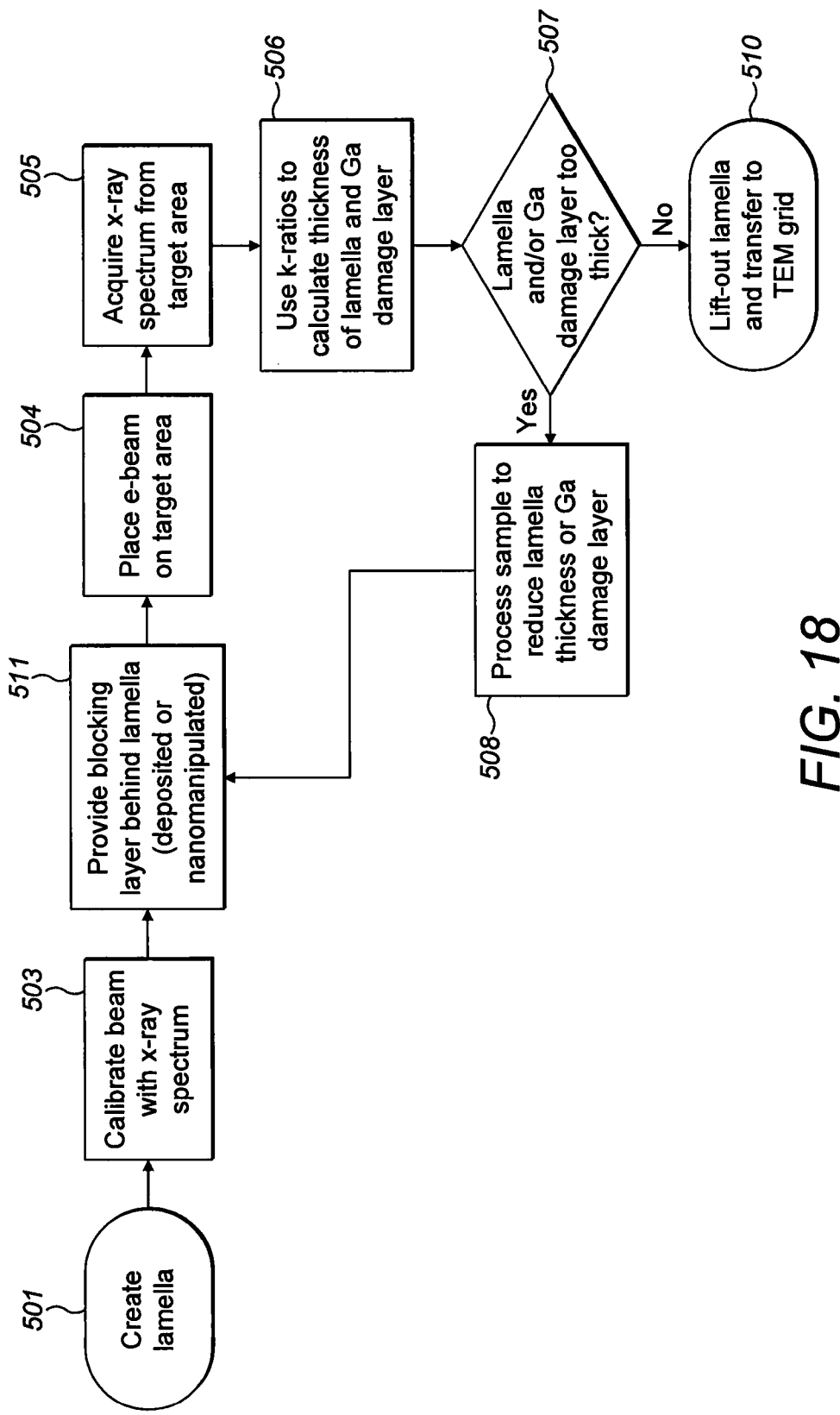
FIG. 18 is a flow diagram illustrating a ninth example method.
Figure 19:
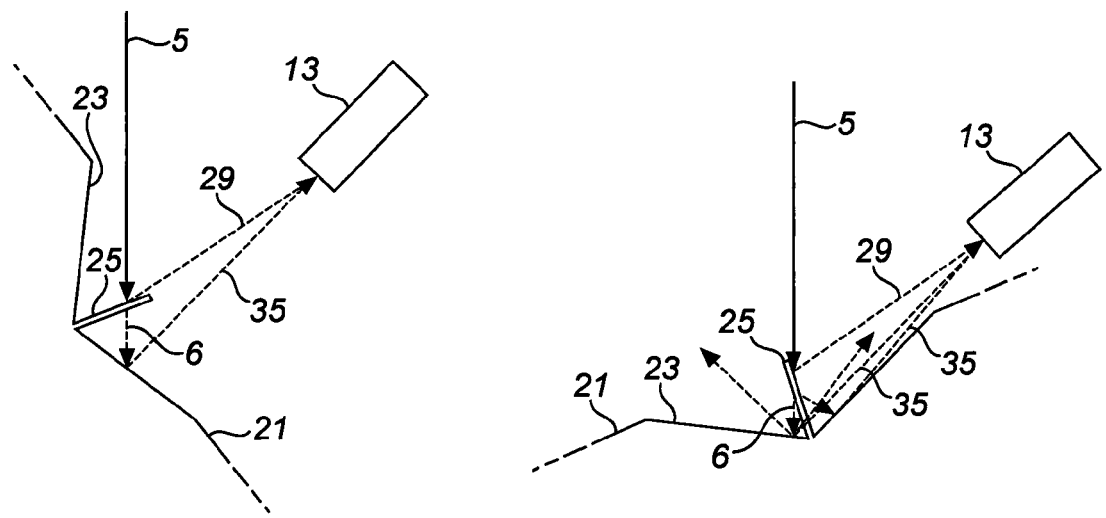
FIG. 19 shows two arrangements in which unwanted x-ray radiation is generated by transmitted and backscattered electrons and is collected by the detector.
Figure 20A:
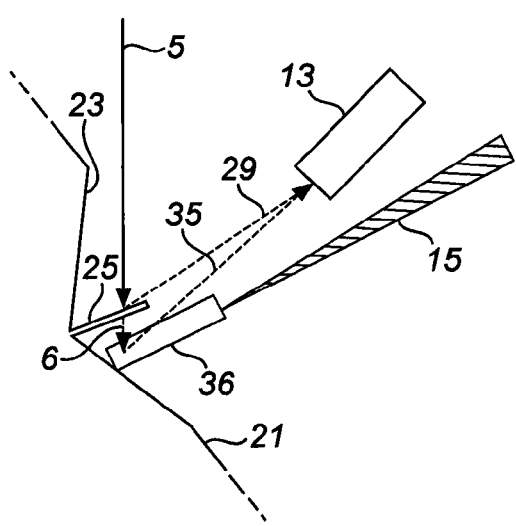
FIG. 20*a* shows the blocking by way of a shield of transmitted electrons in accordance with a tenth example method.

A ninth embodiment of the invention method is illustrated by the flow diagram at FIG. 18. This example differs from the previous embodiment firstly in that the measurement and thinning process is carried out with the lamella remaining attached to the original sample, in accordance with the first embodiment. In this example, the problem of unwanted x-ray radiation being produced by electrons that have scattered out of the lamella and have interacted with the material of the trench sidewalls is remedied by way of a technique for blocking or absorbing the electrons from the particle beam. This problem is visualised by the two geometries depicted at FIG. 19, wherein electrons 6 that are transmitted through the lamella interact with the sidewalls of trench 23 to produce x-rays 35 and therefore detector 13 receives x-rays originating at multiple points. The blocking means is provided at step 511 in the method of FIG. 18, prior to the impingement of the electron beam upon the target sample at step 504. This step is illustrated at FIG. 20a, wherein a manipulator probe 15 is used to hold a shield material 36 which may for instance be welded to the probe tip or held by a gripper probe. Shield 36 is positioned on the side of lamella 25 out of which transmitted electrons 6 exit the lamella. The shield material is different from the material present in the trench 23 and is different from the materials present in the lamella so as to obviate the production of artefacts in the x-ray data. The shield 36 is provided to be sufficiently thick to absorb the electron beam 6, so that the transmitted electrons 6 will be prevented from striking the surface of the trench 23.

If the shield 36 is positioned immediately beneath the lamella 25 so that the electrons that are backscattered from the shield strike the lamella, then the theoretical model used for FIG. 3 may be modified so that the material of the shield 36 is modelled as the substrate rather than beryllium or a vacuum.

A tenth embodiment, wherein the detection of unwanted x-rays 35 generated by transmitted electrons 6 is prevented by an alternative method is illustrated at FIG. 21a. In this embodiment, prior to acquiring x-ray data from the lamella, the manipulator probe 15 is positioned on the electron beam exit side of the lamella 25. The probe material is different from the material present in the trench and in the lamella, and the probe is sufficiently thick that electron beam 6 is fully absorbed.

Figure 20B:
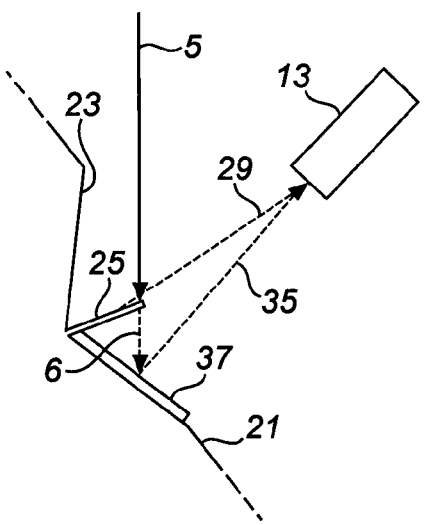
FIG. 20*b* shows the blocking of transmitted electrons by way of a shielding layer applied to the trench sidewall in accordance with an eleventh example method.

An eleventh embodiment includes a further alternative means of preventing the detection of spurious x-rays 35 and is illustrated at FIG. 20b. In this example an additional layer 37 is deposited on the sidewalls of trench 23 in order to block electrons from entering the sidewall and stopping the excitation of x-rays from therein. The additional layer may be deposited for instance using gas injection system 17. The gas is injected through a needle and a localised deposition of material on the trench sidewalls can be achieved by rastering the focussed ion beam 7, configured to be incident parallel to the target surface of the lamella, on the trench walls. The layer 37 is of sufficient thickness to absorb the electron beam and stop x-rays being generated within the specimen material in the trench, for example a 150 nanometer thick layer of platinum is sufficient to absorb a 10 kV incident electron beam 5.

A twelfth embodiment of the invention comprises an alternative means of mitigating the effect of unwanted x-rays 35 on the determination of the target sample thickness, and is illustrated at FIG. 21b. In contrast to the previous three embodiments, electrons 6 are not physically blocked from entering and interacting with the material of the sidewall in trench 23. Instead, the lamella thickness is determined indirectly by measuring the spectrum of x-rays acquired from a top layer 38 of carbon or platinum. Prior to the preparation of the lamella from original sample 21, a layer 38 of platinum, carbon or tungsten is deposited on the surface of original sample 21 from which the lamella is to be milled.

FIG. 22 shows an example of a target sample being produced in this way. The deposition of additional layer 38 is carried out by injecting a gas close to the surface of original sample 21 and decomposing it using an electron beam or an ion beam. As shown in FIG. 22 material 38 is commonly deposited along a strip corresponding to the width and thickness of the lamella that is to be formed. This is done in order to protect the target sample 25 during the subsequent processing when the material surrounding the lamella is removed using the focussed ion beam 7. The thickness of the layer deposited is considerably larger than the final width of the lamella 25 and the layer remains present on top of the lamella after the material surrounding the lamella has been removed to form trenches 23. The thickness of layer 38 being considerably greater than that of lamella 25 means that the electron beam 5 may be positioned so that the x-rays acquired are produced within the protective layer material 38, without exciting x-rays in the lamella 25. Since the thickness of the protrusion formed by layer 38 is the same as that of the lamella, the x-ray signal acquired from the platinum, tungsten or carbon, for example, will be indicative of the lamella thickness, providing that the material used in layer 38 is not present anywhere proximal to the electron beam 5.

The thickness of the top layer may therefore be determined by the same approach as the flow chart of FIG. 3, modified in that in place of layers of $SiGa_x$ and silicon, a single layer corresponding to the top layer, for example platinum and carbon, is used and emissions of x-rays at energies corresponding to these elements are measured. In this way, x-rays that are characteristic to silicon may be excluded from the thickness determination calculation and therefore the spurious x-rays, if produced, may be ignored.

The invention claimed is:

1. A method of reducing the thickness of a region of a target sample, comprising:
   a) obtaining reference data that is representative of x-rays generated by the interaction of a particle beam with part of a reference sample under a first set of beam conditions, wherein the reference sample has a predetermined composition;
   b) causing the particle beam, under a second set of beam conditions, to impinge upon the region of the target sample;
   c) monitoring x-rays generated by interaction between the particle beam and the target sample so as to produce monitored data;
   d) calculating output data based upon the monitored and reference data; and
   e) removing material from the region of the target sample so as to reduce the thickness of the region in accordance with thickness that is determined from the output data.

2. A method according to claim 1, wherein the reference sample has dimensions that are known or sufficient to act as a bulk material in response to the particle beam.

3. A method according to claim 1, wherein step (a) is performed in accordance with a theoretical representation in which the reference data is calculated based upon a collection solid angle for the generated x-rays and in accordance with the first set of beam conditions.

4. A method according to claim 1, wherein the reference data in step (a) is obtained by causing the particle beam to impinge upon part of a physical reference sample under the first set of beam conditions and monitoring x-rays generated by the interaction between the particle beam and the reference sample so as to produce the reference data.

5. A method according to claim 1, wherein each of steps (a) to (e) is performed in situ within the same apparatus.

6. A method according to claim 1, wherein each of steps (a) to (e) is performed within a focused ion beam scanning electron microscope.

7. A method according to claim 1, wherein the x-rays are monitored with an x-ray detector and wherein the solid angle between the reference sample and the x-ray detector is substantially the same as that between the target sample and the x-ray detector.

8. A method according to claim 1, wherein the first set of beam conditions is different from the second set of beam conditions.

9. A method according to claim 8, wherein the first set and second set of beam conditions include the beam current and wherein the method further comprises monitoring the beam current for one or each of the first and second sets.

10. A method according to claim 9, wherein the calculation of the output data is based upon the beam currents in accordance with the said first and second sets of beam conditions.

11. A method according to claim 8, wherein the beam current is monitored using at least one of: a Faraday cup, an electron absorbent material with an associated electrical current monitor, a known reference material monitored with an electron back scatter detector apparatus.

12. A method according, to claim 1, wherein the thickness of the region of the target sample is reduced to a predetermined thickness.

13. A method according to claim 1, further comprising obtaining a thickness reduction value, and wherein step (e) reduces the thickness of the region in accordance with both the output data and the obtained thickness reduction value.

14. A method according to claim 12, further comprising repeating steps (b) to (e) until the region has the predetermined thickness or the thickness of the region has been reduced by the obtained thickness reduction value.

15. A method according to claim 1, wherein the removing of material from the region of the target sample is performed by a focused ion beam.

16. A method according to claim 1, wherein the particle beam is an electron beam or an x-ray beam.

17. A method according to claim 1, wherein said beam conditions include one or each of the beam energy, current or duration.

18. A method according to claim 1, wherein the output data is calculated in accordance with a model of the region of the target sample.

19. A method according to claim 18, wherein the model includes predicting the x-ray spectrum produced by a specimen of known structure and composition being impinged upon by an electron beam of known characteristics.

20. A method according to claim 18, wherein the model includes predicting a k-ratio for one or more elements in the region of the target sample based upon the reference data.

21. A method according to claim 20, wherein the output data are calculated by comparing the said predicted k-ratios with the k-ratios generated from the monitored data.

22. A method according to claim 18, wherein the model is adjusted iteratively.

23. A method according to claim 18, wherein the model includes layers and wherein the method further comprises identifying the presence of one or more damaged layers in the region of the target sample using the monitored data.

24. A method according to claim 23, further comprising removing material from the damaged layer in the region of the target sample in accordance with the output data.

25. A method according to claim 23, wherein the damaged layer contains a contaminant material.

26. A method according to wherein the reference sample is an elementally pure sample.

27. A method according to claim 1, wherein the target sample has the form of a lamella.

28. A method according to claim 1, wherein the target sample is a protruding portion of an original sample, which remains attached to the original sample and is formed by removing material from parts of the original sample adjacent the target sample so as to form trenches around the protruding portion.

29. A method according to claim 1, wherein the reference sample comprises a region of the original sample.

30. A method according to claim 1, wherein the reference sample is separate from and is mounted near the target sample.

31. A method according to claim 1, wherein the reference sample is mounted on a probe.

32. A method according to claim 1, wherein the target sample is mounted on a probe so that the target sample may be moved and reoriented relative to the particle beam.

33. A method according to claim 1, wherein the target sample is mounted on a probe so that the target sample may be moved and reoriented relative to the particle beam and wherein the reference sample comprises a portion of the probe on which the target sample is mounted.

34. A method according to claim 1, wherein the target sample is mounted on an electron-transparent substrate, the electron-transparent substrate being mounted on an electron-opaque structure and wherein the reference sample comprises an area of the electron-opaque structure.

35. A method according to claim 34, wherein the electron-opaque structure is a TEM grid and wherein the reference sample comprises a region of a grid bar.

36. A method according to claim 1, wherein the target sample is mounted on a post of a sample carrier and wherein the reference sample comprises a region of the post of the sample carrier.

37. A method according to claim 1, wherein when the particle beam causes the generation of spurious x-rays in material other than the target sample, the method further comprises absorbing the particle beam when it has exited the region of the target sample.

38. A method according to claim 37, further comprising absorbing the particle beam using either, part of a probe formed from a material different from the target sample, or, a shield material held by a probe, the shield material being formed from material different from that of the target sample.

39. A method according to claim 28, further comprising applying a shielding layer of material to a trench on an exit side of the target sample, the shielding layer being formed from a material different from the target sample.

40. A method according to claim 1, wherein the target sample is formed from a part of an original sample, wherein at least the said part of the original sample is coated with a second material, said second material being different from the material of the original sample, such that part of the target sample is formed so as to comprise the second material, the part of the target sample formed from the second material being of substantially the same thickness as another part of the target sample; and wherein the said region of the target sample is formed from the second material.

* * * * *